(12) United States Patent
Ehrlichman et al.

(10) Patent No.: US 12,388,533 B2
(45) Date of Patent: *Aug. 12, 2025

(54) LINEARIZED OPTICAL DIGITAL-TO-ANALOG MODULATOR

(71) Applicant: Ramot at Tel-Aviv University Ltd., Tel-Aviv (IL)

(72) Inventors: Yossef Ehrlichman, Nazareth Ilit (IL); Ofer Amrani, Tel Aviv (IL); Shlomo Ruschin, Herzliya (IL)

(73) Assignee: Ramot at Tel-Aviv University Ltd., Tel-Aviv (IL)

(*) Notice: Subject to any disclaimer, the term of this patent is extended or adjusted under 35 U.S.C. 154(b) by 0 days.

This patent is subject to a terminal disclaimer.

(21) Appl. No.: 18/822,532

(22) Filed: Sep. 3, 2024

(65) Prior Publication Data
US 2024/0430011 A1 Dec. 26, 2024

Related U.S. Application Data

(63) Continuation of application No. 18/334,269, filed on Jun. 13, 2023, which is a continuation of application
(Continued)

(51) Int. Cl.
*H03M 1/00* (2006.01)
*G02F 1/01* (2006.01)
(Continued)

(52) U.S. Cl.
CPC ......... *H04B 10/516* (2013.01); *G02F 1/0121* (2013.01); *G02F 1/225* (2013.01);
(Continued)

(58) Field of Classification Search
CPC .............. H04B 10/516; H04B 10/2575; H04B 10/25891; H04B 10/505; H04B 10/541;
(Continued)

(56) References Cited

U.S. PATENT DOCUMENTS

| | | |
|---|---|---|
| 4,288,785 A | 9/1981 | Papuchon et al. |
| 4,613,204 A | 9/1986 | Verber et al. |
| | (Continued) | |

FOREIGN PATENT DOCUMENTS

| | | |
|---|---|---|
| DE | 602005000276 | 5/2007 |
| EP | 0020216 | 12/1980 |
| | (Continued) | |

OTHER PUBLICATIONS

U.S. Appl. No. 60/943,559 filed May 16 2008, Ehrlichman.
(Continued)

*Primary Examiner* — Jean B Jeanglaude

(57) ABSTRACT

In a system for converting digital data into a modulated optical signal, an electrically controllable device, including a modulator having one or more actuating electrodes, provides an analog-modulated optical signal that is modulated in response to output data bits of a digital-to-digital mapping. A digital-to-digital conversion provides the mapping of input data words to the output data bits. The mapping enables adjustments to correct for non-linearities and other undesirable characteristics, thereby improving signal quality.

19 Claims, 13 Drawing Sheets

Related U.S. Application Data

No. 17/736,876, filed on May 4, 2022, now Pat. No. 11,716,148, which is a continuation of application No. 17/481,904, filed on Sep. 22, 2021, now Pat. No. 11,342,998, which is a continuation of application No. 16/532,567, filed on Aug. 6, 2019, now Pat. No. 11,133,872, which is a continuation of application No. 16/386,391, filed on Apr. 17, 2019, now Pat. No. 10,461,866, which is a continuation of application No. 16/234,635, filed on Dec. 28, 2018, now Pat. No. 10,270,535, which is a continuation of application No. 15/298,373, filed on Oct. 20, 2016, now Pat. No. 10,205,527, which is a continuation of application No. 14/922,165, filed on Oct. 25, 2015, now Pat. No. 9,479,191, which is a continuation of application No. 14/662,343, filed on Mar. 19, 2015, now Pat. No. 9,203,425, which is a continuation of application No. 14/325,486, filed on Jul. 8, 2014, now Pat. No. 9,031,417, which is a continuation of application No. 13/280,371, filed on Oct. 25, 2011, now Pat. No. 8,797,198, which is a continuation of application No. 12/636,805, filed on Dec. 14, 2009, now Pat. No. 8,044,835, which is a continuation-in-part of application No. PCT/IL2008/000805, filed on Jun. 12, 2008.

(60) Provisional application No. 60/943,559, filed on Jun. 13, 2007.

(51) Int. Cl.
| | | |
|---|---|---|
| *G02F 1/225* | (2006.01) | |
| *G02F 7/00* | (2006.01) | |
| *H03M 1/70* | (2006.01) | |
| *H04B 10/25* | (2013.01) | |
| *H04B 10/2575* | (2013.01) | |
| *H04B 10/50* | (2013.01) | |
| *H04B 10/516* | (2013.01) | |
| *H04B 10/54* | (2013.01) | |
| *H04B 10/556* | (2013.01) | |
| *G02F 1/015* | (2006.01) | |
| *G02F 1/21* | (2006.01) | |

(52) U.S. Cl.
CPC .............. *G02F 7/00* (2013.01); *H03M 1/002* (2013.01); *H03M 1/70* (2013.01); *H04B 10/2575* (2013.01); *H04B 10/25891* (2020.05); *H04B 10/505* (2013.01); *H04B 10/541* (2013.01); *H04B 10/556* (2013.01); *G02F 1/015* (2013.01); *G02F 1/212* (2021.01); *G02F 2203/19* (2013.01); *H04B 10/5055* (2013.01)

(58) Field of Classification Search
CPC . H04B 10/556; H04B 10/5055; G02F 1/0121; G02F 1/225; G02F 1/225; G02F 7/00; G02F 1/015; G02F 1/212; G02F 2203/19; H03M 1/002; H03M 1/70
USPC ........................................................ 341/137
See application file for complete search history.

(56) References Cited

U.S. PATENT DOCUMENTS

| | | | |
|---|---|---|---|
| 4,649,505 A | 3/1987 | Zinser, Jr. et al. | |
| 5,010,346 A | 4/1991 | Hamilton et al. | |
| 5,137,359 A | 8/1992 | Steele | |
| 5,418,976 A | 5/1995 | Iida | |
| 5,543,952 A | 8/1996 | Yonenaga et al. | |
| 5,625,722 A | 4/1997 | Froberg et al. | |
| 5,694,504 A | 12/1997 | Yu et al. | |
| 5,724,178 A | 3/1998 | Grandpierre et al. | |
| 5,917,638 A | 6/1999 | Franck et al. | |
| 5,977,899 A | 11/1999 | Adams | |
| 6,326,910 B1 | 12/2001 | Hayduk et al. | |
| 6,337,755 B1 | 1/2002 | Cao | |
| 6,760,111 B1 | 7/2004 | Mark et al. | |
| 6,781,537 B1 | 8/2004 | Taraschuk et al. | |
| 6,781,741 B2 | 8/2004 | Uesaka | |
| 7,061,414 B2 | 6/2006 | Chen et al. | |
| 7,146,109 B2 | 12/2006 | Chen et al. | |
| 7,167,651 B2 | 1/2007 | Shpantzer et al. | |
| 7,173,551 B2 | 2/2007 | Vrazel et al. | |
| 7,203,552 B2 | 4/2007 | Solomon | |
| 7,212,292 B2 | 5/2007 | Van Brocklin et al. | |
| 7,277,603 B1 | 10/2007 | Roberts et al. | |
| 7,308,210 B2 | 12/2007 | Khayim et al. | |
| 7,403,711 B2 | 7/2008 | Chen et al. | |
| 7,483,597 B2 | 1/2009 | Shastri et al. | |
| 7,536,112 B2 | 5/2009 | Yonenaga et al. | |
| 7,609,935 B2 | 10/2009 | Burchfiel | |
| 7,792,398 B2 | 9/2010 | Tanaka et al. | |
| 7,873,284 B2 | 1/2011 | Chen et al. | |
| 7,881,354 B2 | 2/2011 | Yoshikawa et al. | |
| 7,978,390 B2 | 7/2011 | Kikuchi | |
| 8,044,835 B2 | 10/2011 | Ehrlichman et al. | |
| 8,078,663 B2 | 12/2011 | Wilson et al. | |
| 8,797,198 B2 | 8/2014 | Ehrlichman et al. | |
| 9,031,417 B2 | 5/2015 | Ehrlichman et al. | |
| 9,203,425 B2 | 12/2015 | Ehrlichman et al. | |
| 9,479,191 B2 | 10/2016 | Ehrlichman et al. | |
| 9,490,902 B2 | 11/2016 | Goodwill | |
| 9,991,966 B1 | 6/2018 | Celo et al. | |
| 10,033,465 B2 | 7/2018 | Ehrlichman et al. | |
| 10,205,527 B2 | 2/2019 | Ehrlichman et al. | |
| 10,270,535 B1 | 4/2019 | Ehrlichman et al. | |
| 10,389,473 B1* | 8/2019 | Vassilieva | H04J 14/0298 |
| 10,461,866 B2 | 10/2019 | Ehrlichman et al. | |
| 10,635,535 B2 | 4/2020 | Cha et al. | |
| 11,133,872 B2 | 9/2021 | Ehrlichman et al. | |
| 11,342,998 B2 | 5/2022 | Ehrlichman et al. | |
| 2003/0076570 A1 | 4/2003 | Schemmann et al. | |
| 2004/0208614 A1 | 10/2004 | Price | |
| 2004/0213170 A1 | 10/2004 | Bremer | |
| 2005/0238367 A1 | 10/2005 | Chen et al. | |
| 2007/0212076 A1 | 9/2007 | Roberts et al. | |
| 2008/0018513 A1 | 1/2008 | Frazier et al. | |
| 2008/0187015 A1 | 8/2008 | Yoshikawa et al. | |
| 2010/0156679 A1 | 6/2010 | Ehrlichman et al. | |
| 2012/0081245 A1 | 4/2012 | Ehrlichman et al. | |
| 2012/0213531 A1 | 8/2012 | Nazarathy et al. | |
| 2012/0301149 A1 | 11/2012 | Pinguet et al. | |
| 2014/0321857 A1 | 10/2014 | Ehrlichman et al. | |
| 2015/0194982 A1 | 7/2015 | Ehrlichman et al. | |
| 2016/0043732 A1 | 2/2016 | Ehrlichman et al. | |
| 2016/0269121 A1 | 9/2016 | Lee et al. | |
| 2017/0294968 A1 | 10/2017 | Ehrlichman et al. | |
| 2017/0302291 A1 | 10/2017 | Ehrlichman et al. | |
| 2019/0273561 A1 | 9/2019 | Ehrlichman et al. | |
| 2019/0363798 A1 | 11/2019 | Ehrlichman et al. | |
| 2022/0077936 A1 | 3/2022 | Ehrlichman et al. | |
| 2022/0271842 A1 | 8/2022 | Ehrlichman et al. | |
| 2023/0403079 A1 | 12/2023 | Ehrlichman et al. | |

FOREIGN PATENT DOCUMENTS

| | | |
|---|---|---|
| EP | 0957596 | 11/1999 |
| EP | 1036302 | 9/2000 |
| EP | 2896993 | 7/2015 |
| JP | 2012-114185 | 6/2012 |
| KR | 10-2004-0054217 | 6/2004 |
| KR | 10-1086788 | 11/2011 |
| KR | 10-1818725 | 1/2018 |
| KR | 10-2018-0015630 | 2/2018 |
| WO | WO 2004/074914 | 9/2004 |

(56) References Cited

FOREIGN PATENT DOCUMENTS

| WO | WO 2008/152642 | 12/2008 |
|---|---|---|
| WO | WO 2016/198282 | 12/2016 |

OTHER PUBLICATIONS

Applicant-Initiated Interview Summary Dated Jul. 29, 2015 From the US Patent and Trademark Office Re. U.S. Appl. No. 14/662,343.
Brief Communication: Oral Proceedings on Sep. 18, 2014 Dated Aug. 25, 2014 From the European Patent Office Re. Application No. 08763563.7.
Claim Construction Memorandum Opinion and Order Dated May 15, 2020 Submitted to the US Patent and Trademark Office Re. Request for Ex Parte Reexamination U.S. Pat. No. 10,033,465. (33 pages).
Claim Construction Order Dated May 15, 2020 from the US District Court for the Eastern District of Texas Marshall Division Re. Case No. 2:19-cv-00225-JRG. (33 pages).
Communication Pursuant to Article 94(3) EPC Dated Aug. 2, 2017 From the European Patent Office Re. Application No. 15157901.8.
Communication Pursuant to Article 94(3) EPC Dated Jul. 12, 2013 From the European Patent Office Re. Application No. 08763563.7.
Communication Pursuant to Article 94(3) EPC Dated Apr. 25, 2018 From the European Patent Office Re. Application No. 15157901.8. (4 Pages).
Communication Pursuant to Article 94(3) EPC Dated Apr. 26, 2010 From the European Patent Office Re. Application No. 08763563.7.
Communication Pursuant to Article 94(3) EPC Dated Jul. 30, 2018 From the European Patent Office Re. Application No. 15157901.8. (4 Pages).
Communication Pursuant to Rule 69 EPC—Reminder Concerning Payment of the Designation Fee (Art. 79(2) EPC) and of the Examination Fee (Art. 94(1) EPC)—and Invitation Pursuant to Rule 70a(1) EPC Dated Jul. 27, 2015 From the European Patent Office Re. Application No. 15157901.8.
Complaint for Patent Infringement Dated Jun. 12, 2019 in the US District Court for the Eastern District of Texas Marshall Division, *Ramot at Tel Aviv University Ltd.* v. *Cisco Systems, Inc.* (28 pages).
Curriculum Vitae of Professor Daniel J. Blumenthal, 43 P.
Decision Denying Institution of Inter Partes Review 35 U.S.C. § 314 Dated May 15, 2020 for IPR2020-00122. (26 pages).
Decision Denying Institution of Inter Partes Review 35 U.S.C. § 314 Dated May 15, 2020 for IPR2020-00123. (26 pages).
Decision Denying Institution of Inter Partes Review 35 U.S.C. § 314 Dated Aug. 18, 2020 for IPR2020-00484. (22 pages).
Decision Denying Institution of Inter Partes Review Under 35. U.S.C. § 314—IPR2020-00484 Dated Aug. 18, 2020 Before the Patent Trial and Appeal Board of the US Patent and Trademark Office Re. U.S. Pat. No. 10,461,866. (21 Pages).
Decision Granting Institution of Inter Partes Review35 USC.§ 314, 37 C.F.R. § 42.4 Dated Feb. 22, 2023 Before the Patent and Appeal Board of the US Patent and Trademark Office Re. U.S. Pat. No. 11,342,998 B2. (91 Pages).
Decision Merging Reexamination Proceedings Dated Mar. 12, 2021 From the US Patent and Trademark Office Re. U.S. Appl. No. 90/014,526. (6 Pages).
Decision Merging Reexamination Proceedures Dated Mar. 12, 2021 From the US Patent and Trademark Office Re. U.S. Appl. No. 90/014,608 & U.S. Appl. No. 90/014,608. (6 Pages).
Decision Merging Reexamination Proceedures Dated Mar. 12, 2021 From the US Patent and Trademark Office Re. U.S. Appl. No. 90/014,528. (6 Pages).
Decision on Petition for Extension of Time in Reexamination Date Feb. 8, 2021 From the US Patent and Trademark Office Re. U.S. Appl. No. 90/014,608. (5 Pages).
Declaration of Daniel Blumenthal Dated Nov. 4, 2019 Under 37 C.F.R. § 1.68 in Support of Petition for Inter Partes Review for U.S. Pat. No. 10,033,465. (135 Pages).
Declaration of Daniel Blumenthal Dated Jan. 30, 2020 Under 37 C.F.R. § 1.68 in Support of Petition for Inter Partes Review for U.S. Pat. No. 10,461,866. (138 Pages).
Declaration of Gerard P. Grenier Dated Jul. 31, 2020 Submitted to the US District Court for the Eastern District of Texas Marshall Division Re. Case No. 2:19-cv-00225-JRG. (54 Pages).
Declaration of Ingrid Hsieh-Yee, PHD, Dated Oct. 31, 2019 Under 37 C.F.R. § 1.68 in Support of Petition for Inter Partes Review (U.S. Pat. No. 10,033,465 and 10,270,535). (83 Pages).
European Search Report and the European Search Opinion Dated Apr. 9, 2015 From the European Patent Office Re. Application No. 15157901.8.
Ex Parte Quayle Dated Jul. 22, 2019 From the US Patent and Trademark Office Re. U.S. Appl. No. 16/386,391. (10 Pages).
Ex Parte Quayle OA Dated Dec. 10, 2019 From the US Patent and Trademark Office Re. U.S. Appl. No. 16/532,567. (14 Pages).
Ex Parte Quayle Official Action Dated Feb. 9, 2022 From the US Patent and Trademark Office Re. U.S. Appl. No. 17/481,904. (19 Pages).
Ex Parte Reexamination Interview Summary—Pilot Program for Waiver of Patent Owner's Statement Dated Jun. 18, 2020 From the US Patent and Trademark Office Re. U.S. Appl. No. 90/014,527. (3 Pages).
Ex Parte Reexamination Interview Summary—Pilot Program for Waiver of Patent Owner's Statement Dated Jun. 18, 2020 From the US Patent and Trademark Office Re. U.S. Appl. No. 90/014,528. (3 Pages).
Ex Parte Reexamination Interview Summary—Pilot Program for Waiver of Patent Owner's Statement Dated Jun. 25, 2020 From the US Patent and Trademark Office Re. U.S. Appl. No. 90/014,526. (3 Pages).
Ex Parte Reexamination Interview Summary-Pilot Program for Waiver of Patent Owners Statement Dated Nov. 18, 2020 From the US Patent and Trademark Office Re. Application No. 90/01,608. (3 Pages).
Ex Parte Reexamination Official Action Dated May 26, 2021 From the US Patent and Trademark Office Re. U.S. Appl. No. 90/014,527. (6 Pages).
Ex Parte Reexamination Official Action Dated Nov. 27, 2020 From the US Patent and Trademark Office Re. U.S. Appl. No. 90/014,527. (26 Pages).
Ex-Parte Reexamination Interview Summary Dated Nov. 18, 2020 from the US Patent and Trademark Office Re. U.S. Appl. No. 90/014,608. (3 pages).
File History for U.S. Appl. No. 12/636,805, now U.S. Pat. No. 8,044,835. (292 Pages).
File History for U.S. Appl. No. 13/280,371, now U.S. Pat. No. 8,979,198. (374 Pages).
File History for U.S. Appl. No. 14/325,486, now U.S. Pat. No. 9,031,417. (427 Pages).
File History for U.S. Appl. No. 14/662,343, now U.S. Pat. No. 9,203,425. (470 Pages).
File History for U.S. Appl. No. 14/922,165, now U.S. Pat. No. 9,479,191. (333 Pages).
File History for U.S. Appl. No. 15/298,373, now U.S. Pat. No. 10,205,527. (390 Pages).
File History for U.S. Reexamination U.S. Appl. No. 90/014,526, now U.S. Pat. No. 10,461,866. (468 Pages).
File History for U.S. Reexamination U.S. Appl. No. 90/014,527, now U.S. Pat. No. 10,270,535. (387 Pages).
International Preliminary Report on Patentability Dated Dec. 7, 2009 From the International Bureau of WIPO Re. Application No. PCT/IL2008/000805.
International Search Report and the Written Opinion Dated Nov. 3, 2008 From the International Searching Authority Re. Application No. PCT/IL2008/000805.
Litigation Search Report CRU 3999 Dated Nov. 18, 2020 Re. Reexam No. U.S. Appl. No. 90/014,608. (46 Pages).
Notice of Allowance Dated Mar. 2, 2015 From the US Patent and Trademark Office Re. U.S. Appl. No. 14/325,486.
Notice of Allowance Dated Sep. 3, 2024 From the US Patent and Trademark Office Re. U.S. Appl. No. 18/334,269. (13 pages).

(56) References Cited

OTHER PUBLICATIONS

Notice Of Allowance Dated Dec. 6, 2018 From the US Patent and Trademark Office Re. U.S. Appl. No. 15/298,373. (3 pages).
Notice Of Allowance Dated Jul. 7, 2016 From the US Patent and Trademark Office Re. U.S. Appl. No. 14/922,165.
Notice of Allowance Dated Mar. 9, 2023 From the US Patent and Trademark Office Re. U.S. Appl. No. 17/736,876. (3 pages).
Notice Of Allowance Dated Apr. 13, 2018 From the US Patent and Trademark Office Re. U.S. Appl. No. 15/298,327. (7 pages).
Notice of Allowance Dated Mar. 14, 2022 From the US Patent and Trademark Office Re. U.S. Appl. No. 17/481,904. (5 Pages).
Notice of Allowance Dated Sep. 14, 2015 From the US Patent and Trademark Office Re. U.S. Appl. No. 14/662,343.
Notice Of Allowance Dated Mar. 18, 2019 From the US Patent and Trademark Office Re. U.S. Appl. No. 16/234,635. (8 pages).
Notice of Allowance Dated Jul. 19, 2011 From the US Patent and Trademark Office Re. U.S. Appl. No. 12/636,805.
Notice of Allowance Dated Mar. 20, 2014 From the US Patent and Trademark Office Re. U.S. Appl. No. 13/280,371.
Notice Of Allowance Dated Aug. 23, 2019 From the US Patent and Trademark Office Re. U.S. Appl. No. 16/386,391. (5 pages).
Notice of Allowance Dated Apr. 24, 2024 From the US Patent and Trademark Office Re. U.S. Appl. No. 18/334,269. (18 pages).
Notice of Allowance Dated May 27, 2021 from the US Patent and Trademark Office Re. U.S. Appl. No. 16/532,567. (10 pages).
Notice of Assignment of Reexamination Request Dated Jun. 11, 2020 From the US Patent and Trademark Office Re. U.S. Appl. No. 90/014,527. (1 Page).
Notice of Assignment of Reexamination Request Dated Jun. 12, 2020 From the US Patent and Trademark Office Re. U.S. Appl. No. 90/014,528. (1 Page).
Notice of Assignment of Reexamination Request Dated Jun. 17, 2020 From the US Patent and Trademark Office Re. U.S. Appl. No. 90/014,526. (1 Page).
Notice of Assignment of Reexamination Request Dated Nov. 18, 2020 From the US Patent and Trademark Office Re. U.S. Appl. No. 90/014,608. (1 Page).
Notice of Reexamination Request Filing Date (Third Party Requester) Dated Jun. 11, 2020 From the US Patent and Trademark Office Re. U.S. Appl. No. 90/014,527. (1 Page).
Notice of Reexamination Request Filing Date (Third Party Requester) Dated Jun. 12, 2020 From the US Patent and Trademark Office Re. U.S. Appl. No. 90/014,528. (1 Page).
Notice of Reexamination Request Filing Date (Third Party Requester) Dated Jun. 17, 2020 From the US Patent and Trademark Office Re. U.S. Appl. No. 90/014,526. (1 Page).
Notice of Reexamination Request Filing Date (Third Party Requester) Dated Nov. 18, 2020 From the US Patent and Trademark Office Re. U.S. Appl. No. 90/014,608. (1 Page).
Office Action in Ex Parte Reexamination Dated Sep. 8, 2021 From the US Patent and Trademark Office Re. U.S. Appl. No. 90/014,526. (32 Page).
Office Action in Ex Parte Reexamination Dated Oct. 13, 2020 From the US Patent and Trademark Office Re. U.S. Appl. No. 90/014,528. (51 Page).
Office Action in Ex Parte Reexamination Dated Oct. 20, 2020 From the US Patent and Trademark Office Re. U.S. Appl. No. 90/014,526. (17 Page).
Official Action Dated Nov. 4, 2013 From the US Patent and Trademark Office Re. U.S. Appl. No. 13/280,371.
Official Action Dated Jun. 7, 2018 From the US Patent and Trademark Office Re. U.S. Appl. No. 15/298,373. (10 pages).
Official Action Dated Aug. 14, 2017 From the US Patent and Trademark Office Re. U.S. Appl. No. 15/298,327. (12 Pages).
Official Action Dated Dec. 14, 2015 From the US Patent and Trademark Office Re. U.S. Appl. No. 14/922,165.
Official Action Dated Feb. 16, 2011 From the US Patent and Trademark Office Re. U.S. Appl. No. 12/636,805.
Official Action Dated Nov. 2, 2020 from the US Patent and Trademark Office Re. U.S. Appl. No. 16/532,567. (20 pages).
Official Action Dated Apr. 20, 2020 from the US Patent and Trademark Office Re. U.S. Appl. No. 16/532,567. (12 pages).
Official Action Dated May 22, 2015 From the US Patent and Trademark Office Re. U.S. Appl. No. 14/662,343.
Official Action Dated Oct. 24, 2017 From the US Patent and Trademark Office Re. U.S. Appl. No. 15/298,373. (18 pages).
Official Action Dated Jul. 25, 2022 From the US Patent and Trademark Office Re. Application No. 171736,876. (7 Pages).
Official Action Dated Aug. 30, 2022 From the US Patent and Trademark Office Re. Application No. 171736,876. (26 Pages).
Official Action Dated Oct. 30, 2014 From the US Patent and Trademark Office Re. U.S. Appl. No. 14/325,486.
Order Granting Request For Ex Parte Reexamination Dated Dec. 10, 2020 from the US Patent and Trademark Office Re. U.S. Appl. No. 90/014,608. (14 pages).
Order Granting Request for Ex Parte Reexamination Dated Jul. 10, 2020 From the US Patent and Trademark Office Re. U.S. Appl. No. 90/014,526. (15 Pages).
Order Granting Request for Ex Parte Reexamination Dated Jul. 20, 2020 From the US Patent and Trademark Office Re. U.S. Appl. No. 90/014,527. (25 Pages).
Order Granting Request for Ex Parte Reexamination Dated Jun. 25, 2020 From the US Patent and Trademark Office Re. U.S. Appl. No. 90/014,528. (37 Pages).
Patent Owner's Preliminary Sur-Reply Dated Jun. 12, 2020 Submitted to the US Patent and Trademark Office Re. Case IPR2020-0484 (U.S. Pat. No. 10,461,866). (7 pages).
Petition for Inter Partes Review Under 35. U.S.C. § 312 and 37 C.F.R. § 42.104—IPR2020-00122 Dated Nov. 5, 2019 Before the Patent and Appeal Board of the US Patent and Trademark Office Re. U.S. Pat. No. 10,033,465. (84 Pages).
Petition for Inter Partes Review Under 35. U.S.C. § 312 and 37 C.F.R. § 42.104—IPR2020-00123 Dated Nov. 5, 2019 Before the Patent and Appeal Board of the US Patent and Trademark Office Re. U.S. Pat. No. 10,270,535. (82 Pages).
Petition for Inter Partes Review Under 35. U.S.C. § 312 and 37 C.F.R. § 42.104—IPR2020-00484 Dated Jan. 31, 2020 Before the Patent Trial and Appeal Board of the US Patent and Trademark Office Re. U.S. Pat. No. 10,461,866. (80 Pages).
Prosecution History for U.S. Appl. No. 15/298,373, now U.S. Pat. No. 10,205,527. (390 Pages).
Prosecution History for U.S. Appl. No. 16/386,391, now U.S. Pat. No. 10,461,866. (421 Pages).
Prosecution History for U.S. Appl. No. 16/234,635, now U.S. Pat. No. 10,270,535. (325 Pages).
Prosecution History of U.S. Appl. No. 15/298,327, now U.S. Pat. No. 10,033,465. (380 Pages).
Provision of A Copy of the Minutes in Accordance With Rule 124(4) EPC Dated Sep. 30, 2014 From the European Patent Office Re. Application No. 08763563.7.
Request for Ex Parte Reexamination Dated Jun. 9, 2020 Submitted to the US Patent and Trademark Office Re. U.S. Pat. No. 10,033,465. (76 pages).
Request for Ex Parte Reexamination Dated Jun. 9, 2020 Submitted to the US Patent and Trademark Office Re. U.S. Pat. No. 10,270,535. (76 pages).
Request for Ex Parte Reexamination Dated Jun. 9, 2020 Submitted to the US Patent and Trademark Office Re. U.S. Pat. No. 10,461,866. (71 pages).
Request for Ex Parte Reexamination U.S. Pat. No. 10,461,866 Dated Nov. 10, 2020. (49).
Restriction Official Action Dated Aug. 11, 2014 From the US Patent and Trademark Office Re. U.S. Appl. No. 14/325,486.
Summons to Attend Oral Proceedings Pursuant to Rule 115(1) EPC Dated Apr. 28, 2014 From the European Patent Office Re. Application No. 08763563.7.
Ackerman et al. "Bias Controllers for External Modulators in Fiber-Optic Systems", Lightwave, 18(5): 1-15, May 1, 2001.
Agrawal "Optical Transmitters: Semiconductor Lasers", Fiber-Optic Communication Systems, 3rd Ed., Chaps.3, 4, 8, 2002.
Bridges et al. "Distortion in Linearized Electrooptic Modulators", IEEE Transactions on Microwave Theory and Techniques, 43(9): 2184-2197, Sep. 1995.

(56) References Cited

OTHER PUBLICATIONS

Ehrlchmann et al. "Photonic Digital to Analog Conversation", Journal of Lightwave Technology, 23(2):764-770, Mar. 7, 2005.

Ehrlichman et al. "Generation of M-Ary Signals Using A Single Mach Zehnder Interfrometer", SPIE Digital Library, 7218, Integrated Optics: Devices, Materials, and Technologies Xiii, 72180L, 5 Pages, Feb. 9, 2009.

Ehrlichman et al. "Generation of M-Ary Signals Using a Single MZI", School of Electrical Engineering Tel Aviv University, Israel,: 14 Pages, Presented at Photonics West 2009.

Ehrlichman et al. "Improved Digital-to-Analog Conversion Using Multi-Electrode Mach-Zehnder Interferometer", Journal of Lightwave Technology, 26(21): 3567-3575, Nov. 1, 2008.

Ehrlichman et al. "Multi-Electrode Approach for Interfacing Optical Computing Devices", School of Electrical Engineering Tel Aviv University, Israel, p. 1-25, Published in Vienna, Austria, Aug. 28, 2008.

Gnauck et al. "Comparison of Direct and External Modulation for CATV Lightwave Transmission at 1.5 mu m Wavelenght", Electronics Letters, 28(20): 1875-1876, Sep. 24, 1992.

Ho "Phase-Modulated Optical Communication Systems", Springer Science & Business Media, p. 2-4, 10, 14, 22, 40-41, 303-316, 430, 2005.

IEEE "The Authoritative Dictionary of IEEE Standards Terms", The Institute of Electrical and Electronics Engineering, IEEE, Standards Information Network, 7th Edition, 11 pages, 2000.

Kaminow et al. Optical Fiber Telecommunications, B: Systems and Networks, Chap.2 ff: 27, 34, 43, 2008.

Leven et al. "A 12.5 GSample/s Optical Digital-to-Analog Converter With 3.8 Effective Bits", The 17th Annual Meeting of the IEEE, Lasers and Electro-Optics Society 2004, LEOS 2004, 1: 270-271, Nov. 2004.

Papuchon et al. "Bits Digital Driven Integrated Amplitude Modulator for Data Processing", Electronic Letters, 16(4): 142-144, 14 Feb. 1980.

Saleh et al. Fundamentals of Photonics, John Wiley & Sons, p. 65-67, 240, 261, 273, 531-536, 616, 1994.

Vawter et al. "Digital Optical Phase Control in Ridge-Waveguide Phase Modulators", IEEE Photonics Technology Letters, XP000362933, 5(3): 313-315, Mar. 1, 1993.

Wang et al. "Research on the Modulation Phase Distortion Error Character of Y Wave-Guide in Fiber Optic Gyroscope", Proceedings of the 2008 International Symposium on Intelligent Information Technology Applications Workshop, IITAW '08, Shanghai, China, Dec. 21-22, 2008, p. 847-850, Dec. 21, 2008.

Yacoubian et al. "Digital-to-Analog Conversion Using Electrooptic Modulators", IEEE Photonics Technology Letters, 15(1): 117-119, Jan. 2003.

Zumbahlen "Basic Linear Design: Digital-to-Analog Converter Architectures: Intentionally Nonlinear DACs", Analog Devices Ltd., Section 6.1: 6.37-6.39, 2007.

\* cited by examiner

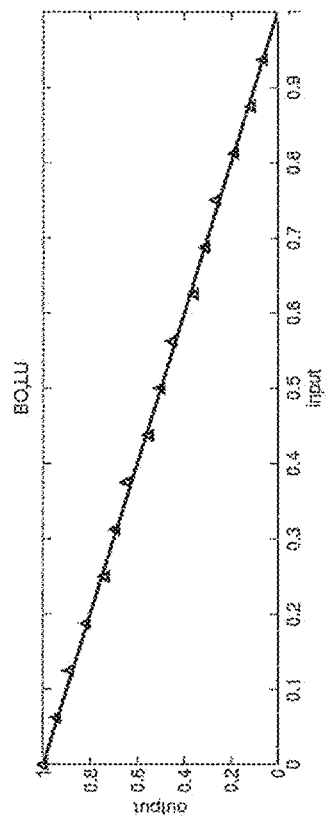
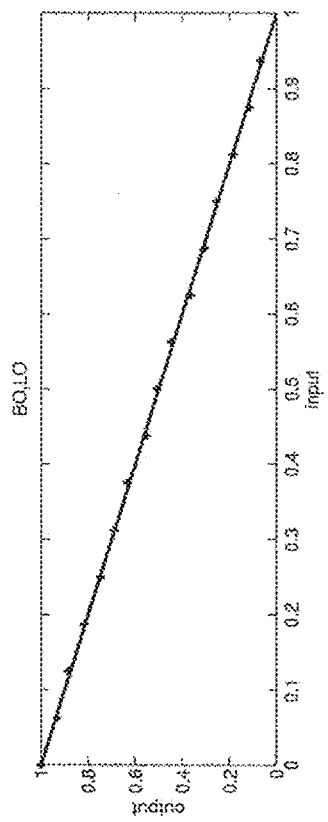
FIG. 3A
FIG. 3B

FIG. 4

| DDC Input | DDC Output |
|---|---|
| 0000 | 0000 |
| 0001 | 0011 |
| 0010 | 0100 |
| 0011 | 0101 |
| 0100 | 0101 |
| 0101 | 0110 |
| 0110 | 0111 |
| 0111 | 0111 |
| 1000 | 1000 |
| 1001 | 1001 |
| 1010 | 1001 |
| 1011 | 1010 |
| 1100 | 1011 |
| 1101 | 1011 |
| 1110 | 1100 |
| 1111 | 1101 |

FIG. 5

| N=4 | | | N=8 | | | | |
|---|---|---|---|---|---|---|---|
| U | | O | U | | O | | |
| M=4.5 | M=4 | M=5 | M=8-10 | M=8 | M=9 | M=10 | |
| 0.5 | 0.4073 | 0.4957 | 0.5 | 0.3871 | 0.5001 | 0.5 | |
| 0.25 | 0.2443 | 0.2451 | 0.25 | 0.2243 | 0.25 | 0.2501 | |
| 0.125 | 0.1506 | 0.1304 | 0.125 | 0.1311 | 0.125 | 0.1249 | |
| 0.0625 | 0.0989 | 0.0527 | 0.0625 | 0.0799 | 0.0625 | 0.0625 | |
| 0.0313 | | 0.038 | 0.0313 | 0.0527 | 0.0313 | 0.0312 | |
| | | | 0.0156 | 0.0385 | 0.0155 | 0.0156 | |
| | | | 0.0078 | 0.0312 | 0.0078 | 0.0079 | |
| | | | 0.0039 | 0.0275 | 0.0038 | 0.004 | |
| | | | 0.002 | | 0.002 | 0.0019 | |
| | | | 0.001 | | | 0.001 | |
| M=4: 0.9375 | 0.9011 | 0.9619 | M=8: 0.9961 | 0.9723 | 0.998 | 0.9991 | |
| M=5: 0.9688 | | | M=9: 0.9981 | | | | |
| | | | M=10: 0.9991 | | | | |

LINEARIZED OPTICAL DIGITAL-TO-ANALOG MODULATOR

RELATED APPLICATIONS

This application is a continuation of U.S. patent application Ser. No. 18/334,269, filed on Jun. 13, 2023, which is a continuation of U.S. patent application Ser. No. 17/736,876 filed on May 4, 2022, now U.S. Pat. No. 11,716,148, which is a continuation of U.S. patent application Ser. No. 17/481,904 filed on Sep. 22, 2021, now U.S. Pat. No. 11,342,998, which is a continuation of U.S. patent application Ser. No. 16/532,567 filed on Aug. 6, 2019, now U.S. Pat. No. 11,133,872, which is a continuation of U.S. patent application Ser. No. 16/386,391, filed Apr. 17, 2019, now U.S. Pat. No. 10,461,866, which is a continuation of U.S. patent application Ser. No. 16/234,635 filed on Dec. 28, 2018, now U.S. Pat. No. 10,270,535, which is a continuation of U.S. patent application Ser. No. 15/298,373 filed on Oct. 20, 2016, now U.S. Pat. No. 10,205,527, which is a continuation of U.S. patent application Ser. No. 14/922,165 filed on Oct. 25, 2015, now U.S. Pat. No. 9,479,191, which is a continuation of U.S. patent application Ser. No. 14/662,343 filed on Mar. 19, 2015, now U.S. Pat. No. 9,203,425, which is a continuation of U.S. patent application Ser. No. 14/325,486 filed on Jul. 8, 2014, now U.S. Pat. No. 9,031,417, which is a continuation of U.S. patent application Ser. No. 13/280,371 filed on Oct. 25, 2011, now U.S. Pat. No. 8,797,198, which is a continuation of U.S. patent application Ser. No. 12/636,805, filed on Dec. 14, 2009, now U.S. Pat. No. 8,044,835, which is a continuation-in-part of PCT Patent Application No. PCT/IL2008/000805 filed on Jun. 12, 2008, which claims the benefit of priority of U.S. Provisional Patent Application No. 60/943,559 filed on Jun. 13, 2007. The contents of the above applications are all incorporated by reference as if fully set forth herein in their entirety.

The contents of the above applications are all incorporated by reference as if fully set forth herein in their entirety.

FIELD AND BACKGROUND OF THE INVENTION

The present invention relates to optical modulators and, in particular, it concerns a linearized optical digital-to-analog modulator.

There is a tangible need for high-performance and large bandwidth digital to analog signal conversion. Furthermore, as the RF and digital domains converge, entirely new solutions will be needed to enable multi-GHz mixed-signal systems. Probably the most prominent area to benefit is the wireless communication industry. The ever increasing thirst for bandwidth will require data converters to deliver greatly increased performance. For example, analog signals are transmitted in cable television (CATV) via optical fibers and the demand for increasing bandwidth is driving technology to speed-up the processing of signals as well as the transmission. High performance digital to analog conversion is also required to address the growing demands of wireless carriers for supporting the heavy traffic expected in the base station. Additional specific areas to benefit include: the defense and government industries that concentrate on deploying multi-function, dynamically reconfigurable systems (RADAR, electronic warfare, and surveillance applications); medical imaging; and hyper/super-computer communications.

One of the most widely deployed devices for analog optics modulation is the Mach-Zehnder Interferometer modulator (MZI). For binary digital signals, it is today the preferred device for long-haul fiber-optic communication, leading to chirp-free pulses which can reach hundreds of kilometers in optical fibers without the need for regeneration. For analog applications, however, a serious problem is encountered due to the inherent non-linear response of the modulator. Specifically, since the modulating voltage via the electro-optic effect controls the optical phase delay in a basically linear fashion and the attenuation varies as the cosine of the phase difference between the two branches of the device, a linear variation in phase difference and thus in applied voltage results in a cosine-shaped output variation, as seen in the pattern of points in FIG. 2A. The common solutions for this problem are either the biasing of the device to a quasi linear regime coupled with reducing the modulation range to reduce distortion, or use of an analog pre-distortion circuit to feed the modulator. Since in practically all present systems signals are processed digitally, a multi-bit Digital-to-Analog Converter (DAC) device is needed with fast processing capabilities.

A DAC based on a multi-electrode MZI modulator concept was proposed many years ago by Papuchon et al. and is described in U.S. Pat. No. 4,288,785. In that device, the electrodes' sectioning length followed a conventional power-of-two digital sequence, which did not solve the non-linearity problem, and thus suffered from severe limitation in the dynamic range, and subsequently the attainable resolution. More recently, much more complex devices have been presented to cope with these problems: Yacoubian et al. ("*Digital-to-analog conversion using electrooptic modulators,*" IEEE Photonics Technology Letters, vol. 15, pp. 117-119, January 2003), proposed the employment of one MZI modulator for each and every bit. A recently reported design by Leven et al. ("*A 12.5 gsamples/s optical digital-to-analog converter with 3.8 effective bits,*" Lasers and Electro-Optics Society, 2004. LEOS 2004. The 17th Annual Meeting of the IEEE, vol. 1, pp. 270-271, November 2004), also the subject of U.S. Pat. No. 7,061,414 entitled "Optical Digital-To-Analog Converter" to Y K Chen et al., employs a single modulator for every 2 bits and is highly nonlinear; it yields only 3.8 effective bits for a 6 bit design.

There is therefore a need for a digital to analog converter which would offer improved linearity of response without sacrificing efficiency or dynamic range.

SUMMARY OF THE INVENTION

The present invention is a linearized optical digital-to-analog modulator.

According to the teachings of the present invention there is provided, a modulator device for converting digital data into analog modulation of the power of an optical signal, the modulator device comprising: (a) an electronic input for receiving an input data word of N bits; (b) an electrically controllable modulator for modulating the intensity of an optical signal, the modulator including M actuating electrodes where M≥N; and (c) an electrode actuating device associated with the electronic input and the modulator, the electrode actuating device being responsive to the input data word to supply an actuating voltage to the actuating electrodes, wherein the electrode actuating device actuates at least one of the actuating electrodes as a function of values of more than one bit of the input data word.

According to a further feature of the present invention, the electrode actuating device includes a digital-to-digital converter.

According to a further feature of the present invention, the modulator is a modulated semiconductor light generating device. According to an alternative feature of the present invention, the modulator is an electro-absorption modulator. According to yet a further alternative, the modulator is a Mach-Zehnder modulator.

According to a further feature of the present invention, in the case of a Mach-Zehnder modulator, the modulator includes M actuating electrodes on each of two waveguide branches of the modulator. In certain preferred cases, M is greater than N.

According to a further feature of the present invention, in the case of a Mach-Zehnder modulator, the electrode actuating device is configured to actuate the first and second pluralities of actuating electrodes so as to modulate the optical signal according to a QAM (Quadrature Amplitude Modulation) modulation scheme with at least 16 constellation points.

According to a further feature of the present invention, the electrode actuating device is configured to actuate the first and second pluralities of actuating electrodes so as to modulate the optical signal to a minimum amplitude for a return-to-zero signal between successive input data words.

According to a further feature of the present invention, the modulator has a maximum dynamic range, and wherein the electrode actuating device is configured to actuate the actuating electrodes so as to generate modulation of the optical signal spanning a majority of the dynamic range.

According to a further feature of the present invention, the electrode actuating device is configured to apply one of two common actuating voltages to the actuating electrodes.

According to a further feature of the present invention, the actuating electrodes have differing effective areas. According to one set of applications, the differing effective areas form a set, members of the set being interrelated approximately by factors of two. In other preferred cases, the set including at least one effective area which is not interrelated to others of the set by factors of two.

According to a further feature of the present invention, the modulator has a non-linear response, and the electrode actuating device is configured to actuate the actuating electrodes so as to generate an improved approximation to a linear modulation of the optical signal as a function of the input data word.

According to a further feature of the present invention, there is also provided an optical to electrical converter deployed so as to generate an electrical signal as a function of intensity of the modulated optical signal.

There is also provided according to a further feature of the present invention, an apparatus comprising a digital-to-analog converter, the converter comprising: (a) an electronic input for receiving an input data word of N bits; (b) an electrically controllable modulator for modulating the intensity of an optical signal, the modulator including M actuating electrodes where M≥N; and (c) an electrode actuating device associated with the electronic input and the modulator, the electrode actuating device being responsive to the input data word to supply an actuating voltage to the actuating electrodes, wherein the electrode actuating device actuates at least one of the actuating electrodes as a function of values of more than one bit of the input data word.

There is also provided according to the teachings of the present invention, a method for converting a digital data input word of N bits into an analog signal comprising: (a) processing the digital data input word to generate an electrode actuation vector of M values where M≥N; and (b) applying M voltage values corresponding to the actuation vector values to M actuating electrodes of an electrically controllable modulator for modulating the intensity of an optical signal, wherein at least one value of the actuation vector varies as a function of values of more than one bit of the input data word.

According to a further feature of the present invention, the electrode actuation vector is a binary vector, and wherein the M voltage values are selected from two voltage levels according to the M binary values.

According to a further feature of the present invention, the processing is performed by a digital-to-digital converter.

According to a further feature of the present invention, an electrical output is generated as a function of the intensity of the modulated optical signal.

There is also provided according to the teachings of the present invention, a modulator device for converting digital data into analog modulation of the power of an optical signal, the modulator device comprising: (a) an electronic input for receiving an input data word of N bits; (b) a semiconductor light generating device for generating an optical signal of variable intensity, the semiconductor light generating device including M actuating electrodes where M≥N; and (c) an electrode actuating device associated with the electronic input and the semiconductor light generating device, the electrode actuating device being responsive to the input data word to supply an actuating voltage to the actuating electrodes, thereby generating an output intensity corresponding substantially to the input data word.

According to a further feature of the present invention, the actuating electrodes have differing effective areas.

According to a further feature of the present invention, the differing effective areas form a set, members of the set being interrelated approximately by factors of two.

According to a further feature of the present invention, the differing effective areas form a set, the set including at least one effective area which is not interrelated to others of the set by factors of two.

According to a further feature of the present invention, M=N.

According to a further feature of the present invention, the semiconductor light generating device is a semiconductor laser.

According to a further feature of the present invention, the semiconductor laser further includes a threshold electrode configured to provide a threshold actuation current.

According to a further feature of the present invention, the semiconductor light generating device is a light emitting diode.

There is also provided according to the teachings of the present invention, a modulator device for converting digital data into analog modulation of the power of an optical signal, the modulator device comprising: (a) an electronic input for receiving an input data word of N bits; (b) an electrically controllable modulator for modulating the intensity of an optical signal, the modulator including M actuating electrodes where M≥N; and (c) an electrode actuating device associated with the electronic input and the modulator, the electrode actuating device being responsive to the input data word to supply an actuating voltage to the actuating electrodes, wherein the actuating electrodes have differing effective areas, the differing effective areas forming a set, the set including at least one effective area which is not interrelated to others of the set by factors of two.

At this point, it will be useful to define various terminology as used herein in the description and claims. The terms "digital" and "analog" are used in their normal senses as common in the field. Specifically, "digital" refers to a form of data where values are stored or processed numerically, typically broken up into bits of a binary number for machine processing, whereas "analog" refers to a form of data in which values are represented by different levels within a range of values of an essentially continuously variable parameter.

The phrase "digital-to-digital converter" is used to refer to a device which maps a set of possible digital input values to a set of possible digital output values, where the input and output values are non-identical. The "digital-to-digital converter" employed by certain embodiments of the present invention is a non-trivial converter in which there is typically not a one-to-one mapping between bits of the input data and bits of the output data, as will be clear from the description following.

The term "binary" is used to refer to values, voltages or other parameters which assume one or other of only two possible values, and modes of operation which use such parameters. In this context, voltage levels are referred to as "common" to a number of electrodes if activation of the electrodes is performed by switching connection of each of the electrodes between the voltage values in question.

The term "electrode" is used to refer to the electrical connections of an optical modulator device through which the device is controlled. In the case of an electrode which applies an electric field to affect the optical properties of an adjacent material, reference is made to an "effective area" which is used as an indication of the relative influence of the electrode compared to that of other electrodes on the optical properties of the underlying waveguide if actuated by a similar voltage. In many cases, the actuating electrodes are all of the same effective width, for example where they overlie a long narrow waveguide. The "effective area" may then be referred to as an "effective length", corresponding to the length of waveguide overlaid by the corresponding electrode and related to the "effective area" by a constant scaling factor. This scaling factor will vary according to variations in shape, width, waveguide properties or other design parameters. Any part of the electrode not overlying the active part of the modulator device or otherwise ineffective for generating modulation of an optical signal is not included in the "effective area".

The term "modulator" is used to refer to any device which outputs an optical signal with controlled variation of intensity, whether the variation is induced during production of the signal (such as in a semiconductor laser) or whether a signal input from another source is modified.

The term "optical power" is used to refer to the quantitative manifestation of the analog optical signal.

BRIEF DESCRIPTION OF THE SEVERAL VIEWS OF THE DRAWINGS

The invention is herein described, by way of example only, with reference to the accompanying drawings, wherein:

FIG. 3A is a graph showing the intensity output achieved by the modulator of the present invention implemented with five actuating electrodes for a four bit input word, where the five electrodes have lengths interrelated by factors of two;

FIG. 3B is a graph similar to FIG. 3A showing the intensity output achieved by further modifying electrode lengths according to a further aspect of the present invention;

FIG. 4 is a table illustrating a digital-to-digital converter input and output where the input corresponds to the input data word and the output corresponds to the electrode actuation pattern for generating the outputs of FIGS. 2B and 2C;

FIG. 5 is a table illustrating unoptimized and optimized normalized electrode lengths for cases on input words of 4 and 8 bits and numbers of electrodes of 4, 5, 8, 9 and 10;

DESCRIPTION OF SPECIFIC EMBODIMENTS OF THE INVENTION

The present invention is a modulator device for converting digital data into analog modulation of an optical signal.

The principles and operation of modulator devices according to the present invention may be better understood with reference to the drawings and the accompanying description.

Figure 1:
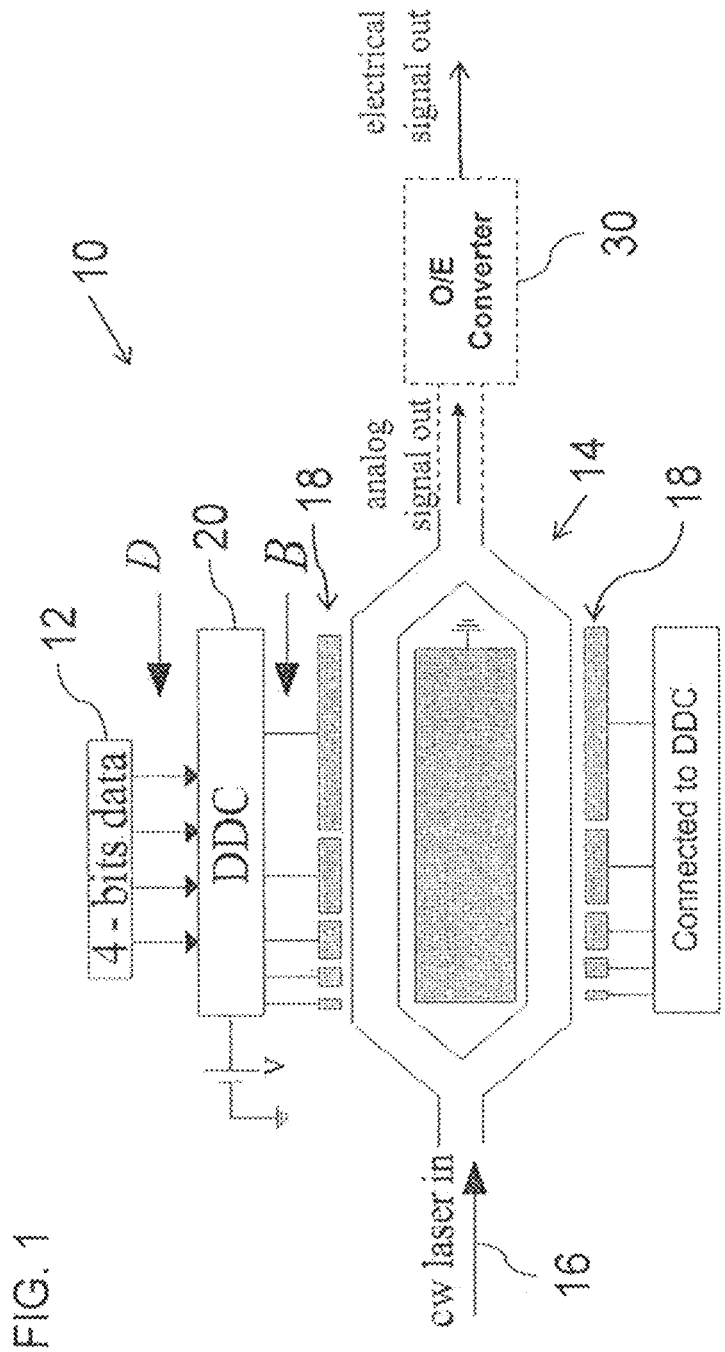
FIG. 1 is a schematic representation of a modulator device, constructed and operative according to the teachings of the present invention, for converting digital data into analog modulation of an optical or electrical signal.

Referring now to the drawings, FIG. 1 shows schematically a modulator device, generally designated 10, constructed and operative according to the teachings of the present invention, for converting digital data into analog modulation of an optical signal. Generally speaking, modulator device 10 has an electronic input 12 for receiving an input data word D of N bits and an electrically controllable modulator 14 for modulating the intensity of an optical signal represented by arrow 16. Modulator 14 includes M actuating electrodes 18 where M≥N. Modulator device 10 also includes an electrode actuating device 20 responsive to the input data word D to supply an actuating voltage to the actuating electrodes 18. It is a particular feature of a first aspect of the present invention that electrode actuating device 20 actuates at least one of actuating electrodes 18 as a function of values of more than one bit of the input data word D. In other words, at least one of the electrodes is actuated in a manner differing from a simple one-to-one mapping of data bits to electrode voltage, thereby providing freedom to choose the electrode actuation pattern which best approximates a desired ideal output for the given input. According to a second complementary, or alternative, aspect of the present invention, the effective areas of actuating electrodes are optimized so that at least some of the electrode effective areas differ from a simple factor-of-two series.

Figure 2A:
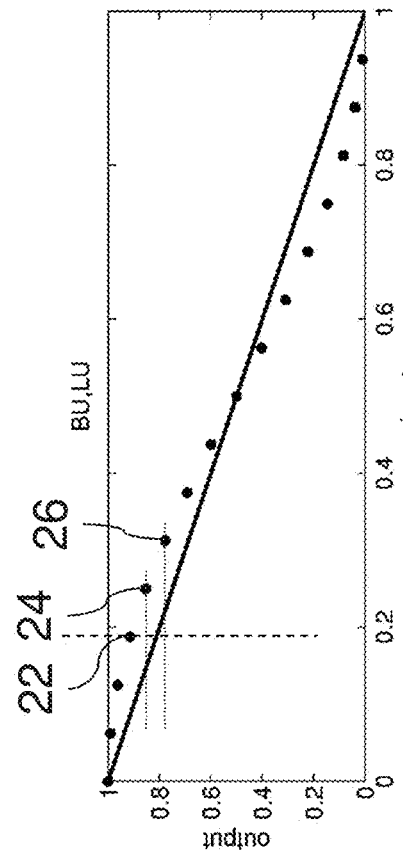
FIG. 2A is a graph showing the intensity output generated by an unmodified Mach-Zehnder modulator employing four electrodes with lengths interrelated by factors of two and driven directly by corresponding bits of a digital input word, the output being shown relative to a line corresponding to an ideal linear response.
Figure 2B:
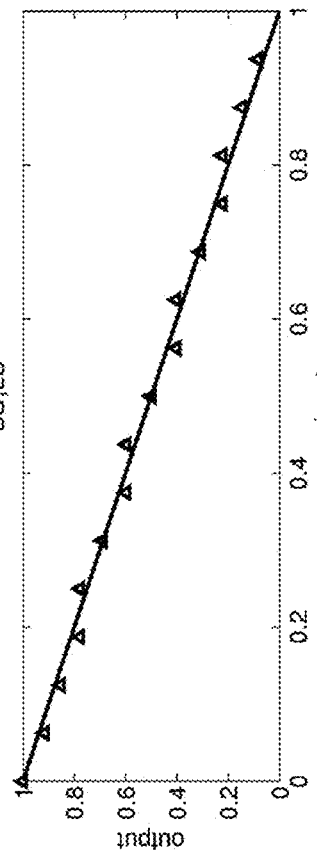
FIG. 2B is a graph showing an intensity output generated according to an implementation of the present invention employing a full-range Mach-Zehnder modulator with four electrodes of lengths interrelated by factors of two driven according to the teachings of the present invention.

The basic operation of a first preferred implementation of modulator device 10 will be understood with reference to FIGS. 2A and 2B. FIG. 2A shows the output intensity values which would be obtained by supplying a voltage sufficient to generate full dynamic range modulation to a set of four electrodes according to a direct mapping of each bit of a 4-bit input data word to a corresponding electrode. The full range of input values 0000 through 1111 and the corresponding output intensities have been normalized to the range 0-1. The marked deviation from linearity in the form of a cosine variation is clearly visible. In contrast, FIG. 2B shows the output intensity using the same four electrodes after the input data has been mapped according to the teachings of the present invention to a pattern of electrode actuation approximating more closely to a linear response. In other words, for each input value, the output value from FIG. 2A most closely approximating the corresponding theoretical linear response is determined, and the corresponding pattern of electrode actuation is applied. By way of example, in FIG. 2A, it will be noted that output point 22 corresponding to an input of 0011 is higher than desired for the ideal linear response. The outputs generated by electrode actuation patterns corresponding to value 0100 (point 24) is closer to the required value, and 0101 (point 26) is even closer. An output pattern of 0101 is thus chosen to correspond to an input of 0011. The overall result is an output which much more closely approximates to a linear response as shown.

Most preferably, electrode actuating device 20 includes a digital-to-digital converter. It will be appreciated that such a converter may be implemented from very straightforward and high-speed logic components which make it feasible to employ the present invention in high frequency systems. Electronic input 12 may be simply the input pins of digital-to-digital converter 20. FIG. 4 illustrates a preferred implementation of the digital-to-digital mapping employed to generate the output of FIG. 2B. A digital-to-digital converter suitable for implementing the various embodiments of the present invention may readily be implemented using commercially available high-speed Application Specific Integrated Circuits ("ASIC"), as will be clear to one ordinarily skilled in the art.

The first implementation described thus far features N=M=4 with lengths of the electrodes retaining the conventional ratios of factors of two and employing simple on-off level voltage switching of a common actuating voltage to all currently actuated actuating electrodes. While such an implementation offers markedly improved linearity of response compared to the unmodified response of FIG. 2A, it should be noted that the output intensity is not uniquely defined for each input value. Where uniqueness of the output values is required, or where a higher degree of linearity is needed, further modification may be required. Various forms of further modification may be employed including, but not limited to: use of multiple actuating voltage levels; use of modified electrode lengths; and addition of additional electrodes (i.e., M>N). These different options will be discussed below.

One option for further modification of the output is to modify the actuating voltage applied to each electrode, such as by switching between different distinct voltage levels.

Figure 2C:
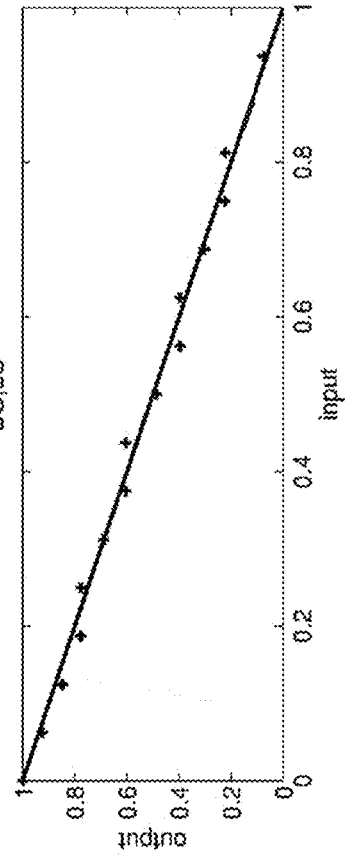
FIG. 2C is a graph similar to FIG. 2B showing the intensity output achieved by further modifying electrode lengths according to a further aspect of the present invention.

An alternative preferred option for modifying the output to achieve a better approximation to a linear output is modification of the electrode lengths relative to the factor of two series assumed above. A non-limiting example of an approach for determining preferred electrode proportions will be presented below in the context of a Mach-Zehnder modulator. A corresponding practical example of electrode length values for N=M=4 is shown in the second column of FIG. 5. FIG. 2C illustrates the intensity output employing electrodes with lengths in the proportions listed. A comparison of the root-mean-square error from linearity for FIGS. 2B and 2C shows that the adjustment of electrode lengths results in an additional slight improvement to linearity.

A further option for modifying the performance of modulator device 10 is the addition of one or more additional electrodes, i.e., M>N. This provides an additional degree of freedom for correcting non-linearity of the response. In the case of unmodified electrode dimensions related by factors of two, each additional electrode is typically half the dimension of the previously smallest electrode. Where the electrode dimensions are further modified, the additional electrode dimension is preferably included within an optimization process in order to determine a preferred dimension for the additional electrode(s) along with the other electrodes. FIGS. 3A and 3B show outputs from the device of the present invention for an example of N=4 and M=5, with and without modification of the electrode dimensions, respectively. The electrode lengths are shown for the unmodified series in the first column of FIG. 5 and for the optimized length electrodes in the third column of FIG. 5.

Parenthetically, although the present invention is described herein in the context of a preferred example of linearization of a modulator device which inherently has a non-linear response, the principles of the present invention may equally be applied to any case where a natural response of a modulator provides a first function and a desired response is a different second function which may be linear or non-linear. Thus, the present invention may be employed to convert a digital input into an analog output approximating to any desired response curve within the dynamic range of the modulator. Non-limiting examples include where a desired output response curve is sinusoidal or exponential, or where it is desired to increase the resolution or "contrast" of the output within a specific range of input values.

Figure 6A:
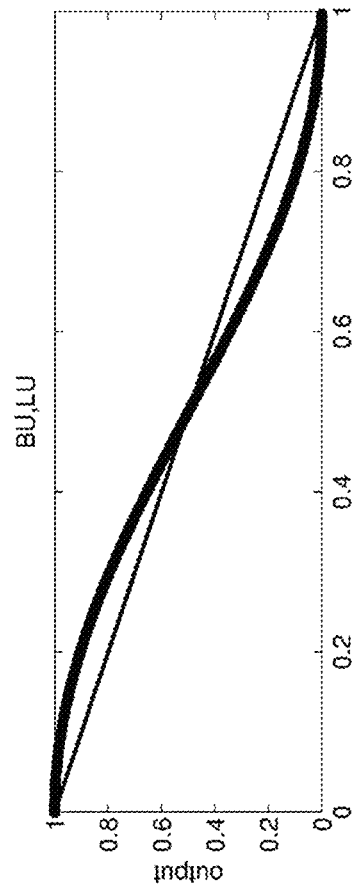
FIG. 6A is a graph showing the intensity output generated by an unmodified Mach-Zehnder modulator employing eight electrodes with lengths interrelated by factors of two and driven directly by corresponding bits of a digital input word, the output being shown relative to a line corresponding to an ideal linear response.
Figure 6B:
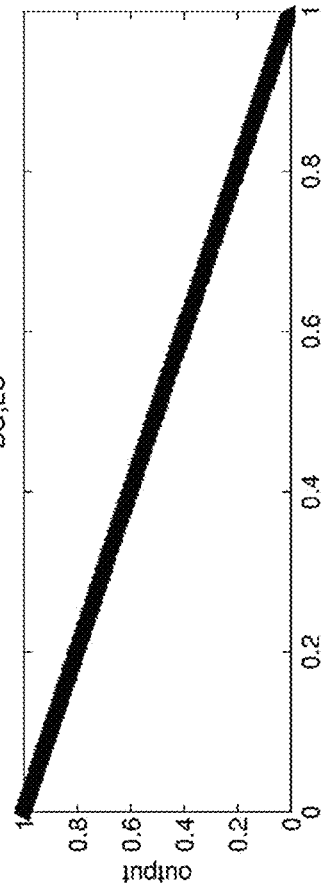
FIG. 6B is a graph showing an intensity output generated according to an implementation of the present invention employing a Mach-Zehnder modulator with eight electrodes of lengths interrelated by factors of two driven according to the teachings of the present invention.
Figure 6C:
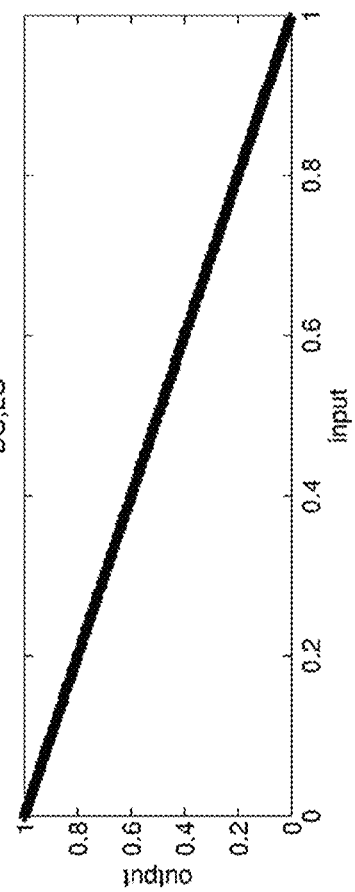
FIG. 6C is a graph similar to FIG. 6B showing the intensity output achieved by further modifying electrode lengths according to a further aspect of the present invention.
Figure 7A:
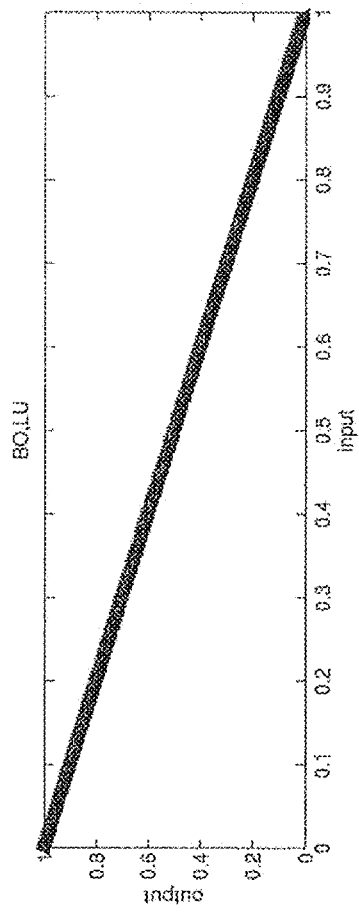
FIG. 7A is a graph showing the intensity output achieved by the modulator of the present invention implemented with nine actuating electrodes for an eight bit input word, where the nine electrodes have lengths interrelated by factors of two.
Figure 7B:
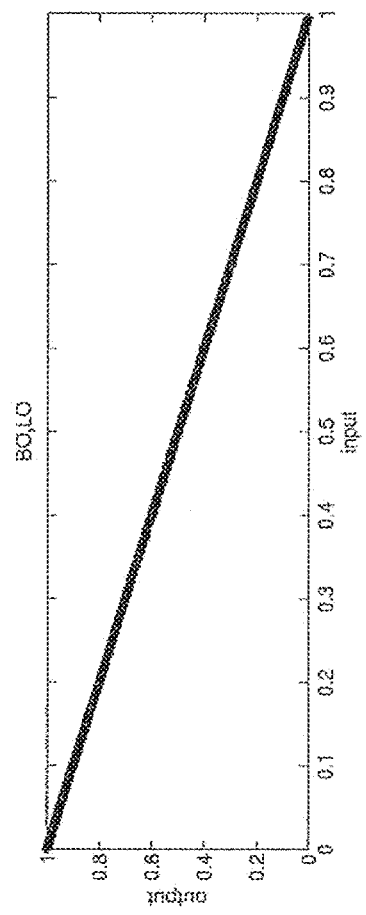
FIG. 7B is a graph similar to FIG. 7A showing the intensity output achieved by further modifying electrode lengths according to a further aspect of the present invention.

Clearly, the present invention is not limited to applications with 4-bit data input, and can be implemented with substantially any number of data bits commensurable with other limitations of the system, such as signal-to-noise requirements. By way of example, FIGS. 6A-6C, 7A and 7B illustrate a number of implementations with 8-bit input data words. Specifically, for purpose of reference, FIG. 6A shows the unmodified output of an 8-bit arrangement where each data bit is applied directly to a corresponding electrode, again showing the underlying cosine response of the modulator. FIG. 6B illustrates the output of an implementation according to the teachings of the present invention with N=M=8 and standard lengths of electrodes interrelated by factors of 2, as in the fourth column of FIG. 5. FIG. 6C shows output for a similar device where the electrode lengths have been modified according to the values shown in the fifth column of FIG. 5. FIGS. 7A and 7B show the output of similar devices for N=8 but with an extra electrode, i.e., M=9. In the case of FIG. 7A, the device has unmodified electrode lengths as shown in the fourth column of FIG. 5, while in the device of FIG. 7B, the electrode lengths are modified according to the proportions shown in the sixth column of FIG. 5.

Example I

Mach-Zehnder Modulator

By way of example, there will now be presented a theoretical treatment of one particularly preferred example of modulator device 10 implemented using a Mach-Zehnder modulator, also referred to as a Mach-Zehnder Interferometer or "MZI". This theoretical treatment is presented to facilitate an understanding of the present invention and as a suggested technique for calculating certain parameters. However, it should be noted that the invention as described above has been found to be effective, independent of the accuracy or otherwise of this theoretical treatment.

The Mach-Zehnder modulator is an active integrated waveguide device consisting of a higher index guide region that splits into two paths which are combined again after a certain distance. Each of these paths is referred to as a leg or branch. When used as a switch, the MZI may be turned "off" by raising or lowering the index of refraction in one of the legs. This is achieved by employing the electro-optic effect to produce a 180-degree change in phase by means of optical-path length. Intermediate optical attenuation levels can be obtained by inducing changes other than 180 degrees.

In the case described above of FIG. 1, a 4-bit Digital-to-Analog Converter, based on a Multi-Electrode (ME) Mach-Zehnder Interferometer, is presented. The input to the device consists of 4 bits. Using the Digital-to-Digital converter, which may be thought of as a look-up table, the 4 data bits are mapped to 5 electrodes as this realization is equipped with a single excess electrode. According to one option, if an electrical rather than optical output is desired, the optical signal at the output is detected and converted to an electrical (analog) signal.

It should be noted that, in the context of a MZI, it is common to split the electrodes to act in an opposite manner on the two legs of the device, for example, one side raising and the other lowering the refractive index of the material, thereby reducing the actuation voltage required. In such cases, the value M is the number of actuating electrodes on each of the two waveguide branches of the modulator.

Mathematical Description

The properties of the MZI may be described mathematically as follows. Let l denote a vector of electrode lengths. The number of elements in l is M. Also let V denote a corresponding vector (of length M) of electrode control-voltages. When applying a voltage $V_j$ only to electrode $e_j$, whose length is $l_j$, the phase of light propagating in the modulating leg, shifts by $$\pi \frac{V_j \cdot l_j}{v_\pi \cdot l_\pi},$$

where $V_\pi \cdot l_\pi$ corresponds to the voltage-length product leading to a $\pi$ shift in the phase. It is used as a merit figure of the MZI modulator. We define new normalized electrode length by:

$$L_j = \frac{l_j}{l_\pi} \tag{1}$$

Gathering the total contribution from all electrodes, the following transmission function of the MZI is obtained:

$$T(V, L) = \cos^2\left(\frac{\pi}{2} \frac{V \cdot L^T}{v_\pi}\right), \tag{2}$$

where the superscript T denotes transposition. The contribution from each electrode $e_j$, j=1,2, ... M, to the total phase shift, is permitted by applying some non-zero voltage $V_j$=v. We chose to work with binary values for all electrode voltages, $V_j$=0, v, a clearly desirable requirement which, moreover, makes the design simpler as discussed next. Note that by setting the lower voltage to a value greater than zero, the maximum output level of the MZI is decreased thus reducing the dynamic range. Let $D_i$ denote a digital binary input vector of length N, where i=1, ..., $2^N$. For each digital vector $D_i$, the DDC component in FIG. 1 produces a corresponding binary vector $B_i$, of length M. $B_i$ multiplied by v, represents the actual (internal) vector of voltages controlling the M electrodes. When multiplying a real number, $B_i$ should be interpreted as binary vector whose elements are the real numbers {0,1}. With respect to (2), this means that when $V_j$=v, then $B_{ij}$=1, and when $V_j$=0, $B_{ij}$=0; $B_{ij}$ being the j-th element of the control vector $B_i$. At this time we define B to be a matrix of size $2^N \times M$ whose rows consist of the set of binary control vectors $B_i$, each of length M. Hence, (2) can be rewritten as $$T(B_i, L) = \cos^2\left(\frac{\pi}{2}\frac{v}{v_\pi}\sum_{j=1}^{M} B_{ij} L_j\right) \quad (3)$$

Without loss of generality $v=v_\pi$ will be assumed henceforth. (Preferably $V_j=v_\pi$ to ensure full coverage of the modulating range and efficient use of the input optical power.) When the number of electrodes equals the number of data bits, i.e. when M=N, an implementation in a standard approach according to the system of FIG. 10 while trying to exploit the dynamic range of the transfer function (3) to its fullest results in high nonlinearity errors. This is demonstrated in FIG. 2A for M=N=4. For this demonstration it is assumed that an unoptimized straightforward selection is made, where B is the set of all 16 binary 4-tuples, i.e. $B^T$={0000, . . . , 1111} and L is taken as {0.5,0.25,0.125, 0.0625}. In the next section, one suggested approach to optimizing L and B will be proposed.

Optimization of B and L

In order to improve the linearity as well as the dynamic range of the conversion process, we propose that the lengths of the elements of L and the control vectors B be optimized. As described above, it is possible to optimize one or both of B and L. In practice, optimization of L alone may provide a non-monotonic variation of output together with some improvement in linearity and dynamic range. This may be sufficient for applications in which the non-linearity is relatively small, such as the semiconductor laser embodiments to be discussed below. For more significantly non-linear devices, the options of optimized B with unoptimized L, and optimized B and L are typically more suitable.

We consider these options separately since their implementation require different hardware. An unoptimized set of electrode lengths L consists of $L_j=2^{-j}$, with j=1 . . . M. An unoptimized matrix B will consist of all $2^N$ binary N-tuples. In that case, with a slight abuse of notations we have that $B_i=D_i$; i=0,1, 2, . . . $2^N-1$. Hence, designs with optimized B require Digital-to-Digital conversion while designs with optimized L only do not. Whenever B is optimized, and for any number of electrodes M; M≥N, it is understood that a binary input data vector $D_i$ has to be mapped to a control vector $B_{i,y_e t}$ $B_i \neq D_i$. The DDC, implemented as all-electronic, shall perform this mapping operation.

As the optimization criterion we shall use the root mean square error (RMSE) between an ideal output, represented by a straight line, and the converter output. Let $$g(B, L) = \sqrt{\frac{1}{2^N}\sum_{i=1}^{2^N}\left[U_i - \cos^2\left(\frac{\pi}{2}\sum_{j=1}^{M} B_{ij} L_j\right)\right]^2} \quad (4)$$

denote the ideal analog value required for representing the digital input $D_i$. The RMSE is defined as follows:

$$U_i = \frac{i}{2^N}$$

The optimization problem can now be formulated as minimizing the values of g(B,L) for all possible values of the matrix B and the vector L.

Note that this optimum solution is aimed at minimizing the average (squared) deviation between the desired output and the converter output. Clearly, this is only one non-limiting example, and various other linearity measures may equally be used. Similarly, as mentioned earlier, the desired output response function itself may take any desired form, and for each function, a suitable optimization criterion must be selected.

Approaching (4) as a global optimization problem with an order of $O(2^N \times M)$ variables, is quite involved, especially since the variables are of mixed type, B is binary while L is real. (It is related to a nonlinear mixed integer zero-one optimization problem.) It is therefore typically preferred to employ a near-optimum two-step approach. First, B is determined assuming an unoptimized set of electrodes L, $L_j=2^{-j}$, with j=1 . . . M. The obtained matrix is denoted by $\hat{B}$. Then, given $\hat{B}$, L is obtained such that (4) is minimized.

If L is an unoptimized set of electrodes, $L_j=2^{-j}$. Then, the output of the converter as given by (3) is a function of the control $B_i$ only. Since one aims at obtaining a straight line, whose quantized values are given by $U_i$, then it is not difficult to verify that the best approximated selection of $\hat{B}$ is given by $$\hat{B}_i = Dec2Bin_M\left(\frac{2}{\pi}\arccos(\sqrt{U_i})\right), \quad (5)$$

where the function $Dec2Bin_M(x)$ maps a real value x, 0<x≤1, to its closest M-bit binary representation. Note that this, in effect quantization, process may result in several input data vectors having the same analog representation. In applications in which this duplicate representation is considered problematic, it is effectively mitigated by choosing M>N.

Given $\hat{B}$, we proceed to optimize L. Assuming there exists a set of electrodes L such that $$\cos^2\left(\frac{\pi}{2}\sum_{j=1}^{M}\hat{B}_{ij} L_j\right) \approx U_i; \forall i,$$

then as an alternative to (4), we may define an equivalent cost function, which is easier to handle mathematically:

$$h(L) = \left\{\sum_{i=1}^{2^N}\left[\frac{2}{\pi}\arccos(\sqrt{U_i}) - \sum_{j=1}^{M}\hat{B}_{ij} L_j\right]^2\right\}. \quad (6)$$

To minimize this cost function, one needs to differentiate h(L) with respect to L and equate to 0:

$$\frac{\partial h}{\partial L_k} = 2\left\{\sum_{i=1}^{2^N}\hat{B}_{ik}\left[\frac{2}{\pi}\arccos(\sqrt{U_i}) - \sum_{j=1}^{M}\hat{B}_{ij} L_j\right]\right\} = 0; \forall k. \quad (7)$$

The following equation (more precisely set of equations) is obtained $$\sum_{i=1}^{2^N}\sum_{j=1}^{M}\hat{B}_{ik}\hat{B}_{ij} L_j = \sum_{i=1}^{2^N}\hat{B}_{ik}\frac{2}{\pi}\arccos(\sqrt{U_i}), \quad (8)$$

where k=1,2 . . . M. In matrix notation the set of equation translates to a simple expression $$L = \left(\hat{B}^T \hat{B}\right)^{-1} \frac{2}{\pi} [\arccos(\sqrt{U})\hat{B}]^T, \qquad (9)$$

where $\sqrt{U}$ amounts to a component-wise square root. The solution above grants us an optimized vector of lengths L.

Example II

Electro-Absorption Modulator

Figure 8:
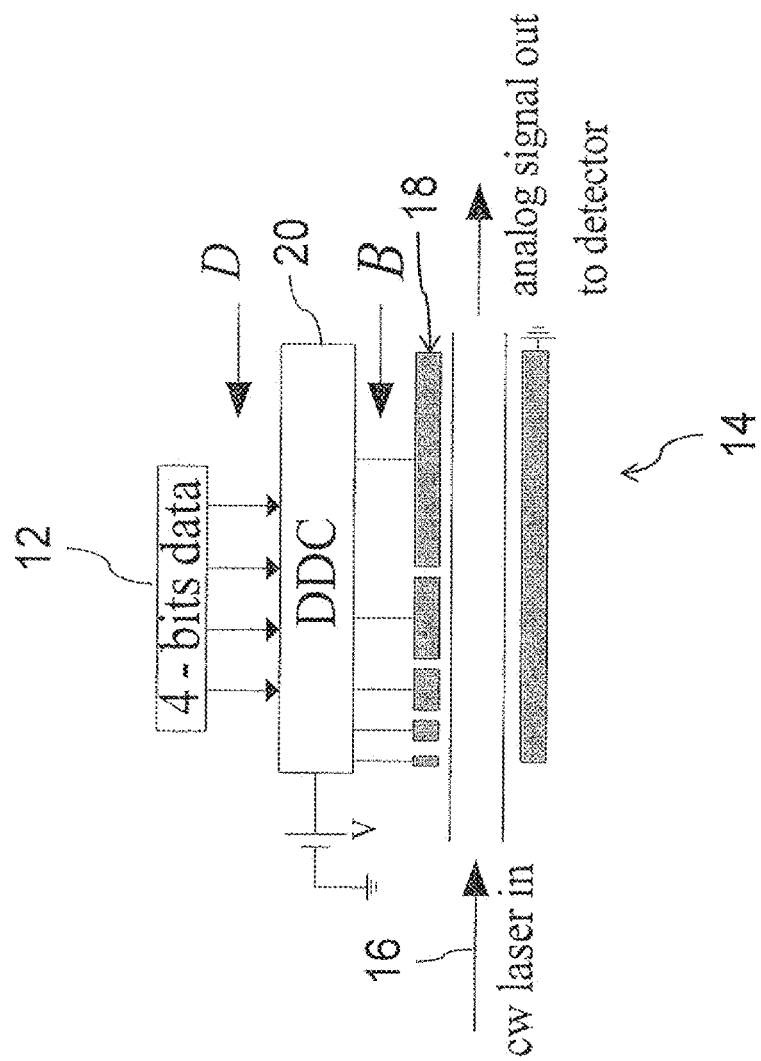
FIG. 8 is a schematic representation of an alternative implementation of the present invention based upon an electro-absorption modulator (EAM)

As mentioned earlier, the present invention is not limited to implementations based on Mach-Zehnder modulators, and can be implemented using any device which modulates light intensity as a function of applied voltage. By way of one additional non-limiting implementation, FIG. 8 shows an analogous implementation of the present invention using an electro-absorption modulator.

An electro-absorption modulator (EAM) is a semiconductor device which allows control of the intensity of a laser beam via an electric voltage. Its operational principle is typically based on the Franz-Keldysh effect, i.e., a change of the absorption spectrum caused by an applied electric field, which usually does not involve the excitation of carriers by the electric field.

By realizing N or more electrodes we can use the EAM as a high speed electro-optical Digital-to-Analog converter, in a similar fashion as we used the MZI. As in modulator device 10 described above, this device includes an electronic input 12 for receiving an input data word D of N bits and an electrically controllable modulator 14 with M electrodes for modulating the intensity of an optical signal represented by arrow 16. An electrode actuating device 20 is responsive to the input data word D to supply an actuating voltage to the actuating electrodes 18.

Here too, to mitigate the non-linear behavior of the device, electrode actuating device 20 serves as a Digital-To-Digital Converter is employed to map an N bit input to a set of M electrodes, determining which of the M electrodes is actuated for each input value. The particular mapping varies according to the response characteristic of the particular modulator, but the principles of operation are fully analogous to those described above in the context of the Mach-Zehnder modulator implementation.

Example III

Modulated Light Generation Device

The present invention is applicable also to other devices where digital information carried by voltage or current is translated into analog optical signals in the form of optical power. This includes also light generation devices like Light Emitting Diodes (LED) or semiconductor lasers. By way of illustration, FIG. 9 shows a semiconductor laser implementation of the present invention.

Figure 9:
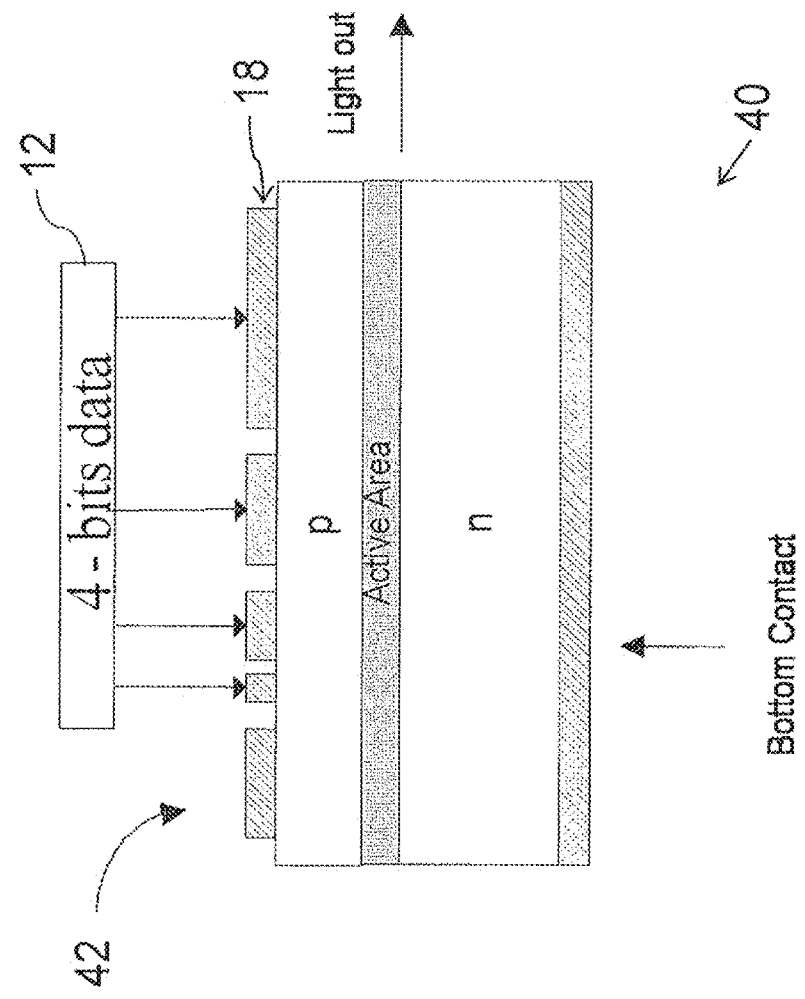
FIG. 9 is a schematic representation of yet another alternative implementation of the present invention based upon a semiconductor laser.

Specifically, FIG. 9 shows a semiconductor laser DAC device, generally designated 40, constructed and operative according to the teachings of the present invention. The actuating electrode, typically implemented as a single contiguous electrode, is here subdivided into a threshold electrode 42 and M actuating electrodes 18. The threshold electrode 42 is typically needed to reach a minimum activation current below which no significant output is generated. Actuating electrodes 18 are actuated as a function of the data bits of a digital input 12, in this case a 4-bit data word, to generate an analog optical signal output of intensity representing the digital input.

In the particularly simple implementation illustrated here, neither L nor B is optimized. In other words, each actuating electrode 18 is part of a set interrelated with effective areas in 2:1 relation, and each electrode is actuated as a function of corresponding single bit of the input data word. The actuating current is typically roughly proportional to the area of electrodes actuated. This case is in itself believed to be patentable, and is thought to be of practical importance. Optionally, a closer approximation to a linear response can be achieved by modifying L (electrode proportions) and/or B (by including a DDC, not shown), all according to the principles discussed in detail above.

It will be appreciated that a similar device may be implemented using other semiconductor light generating devices, such as LEDs. Depending upon the details of the device used, threshold electrode 42 may not be necessary. This and any other necessary device-specific modifications will be self-evident to one ordinarily skilled in the art.

Example IV

QAM Transmitter

Although described above in the context of devices for intensity/amplitude modulation, it should be noted that various embodiments of the present invention are also effective for modifying the phase of an optical signal, and can therefore be used as highly compact and simple QAM (Quadrature Amplitude Modulation) modulators or transmitters.

Specifically, referring back to FIG. 1, it will be noted that, by configuring the digital-to-digital converter DDC 20 to apply different actuation patterns to the electrodes on the two branches of the Mach Zehnder Modulator (MZM), modulation of the output signal phase can be achieved. Such an implementation will now be described with specific reference to FIGS. 10-13B.

Figure 10:
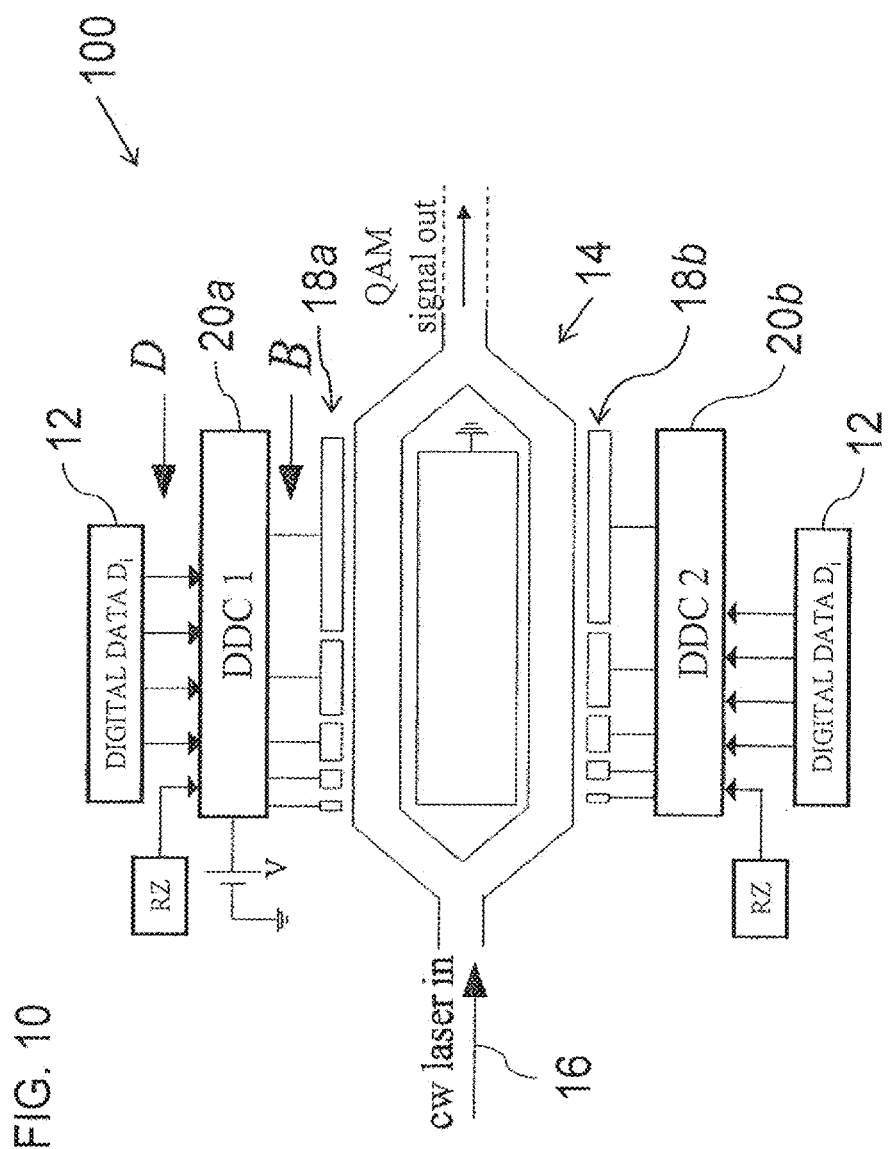
FIG. 10 is a schematic representation of a modulator device, similar to the device of FIG. 1, implemented as a 16-QAM modulator.

Turning now to FIG. 10, there is shown a modulator device, generally designated 100, implemented as a QAM modulator. Modulator device 100 is essentially similar to the device of FIG. 1, but has been relabeled to convey more clearly its function. Specifically, modulator device 100 has a first plurality $M_1$ of actuating electrodes 18a deployed in operative relation to a first waveguide branch of the modulator and a second plurality $M_2$ of actuating electrodes 18b deployed in operative relation to a second waveguide branch of the modulator. In this case, $M_1=M_2=5$, giving a total number of actuating electrodes M=10. The electrode actuating device is here shown as two distinct digital-to-digital converters 20a and 20b, which are configured to actuate the first and second pluralities of actuating electrodes 18a and 18b in response to a given input data word $D_i$ so as to additionally modulate the phase of the optical signal. Clearly, digital-to-digital converters 20a and 20b can alternatively be combined into a single DDC with M=10 outputs with suitable connections to the actuating electrodes on both branches of the waveguide.

It will be appreciated that modulator device 100 can serve as an optical 16-QAM transmitter based on a single multi-electrode MZM (ME-MZM). Each electrode is divided into 5 segments, separately driven by two voltage signals, 0 and V representing binary 0 and 1, respectively. The center electrode is a common ground for the active electrode segments. The role of the modulator is to generate a desired M-QAM constellation which is composed of complex optical field values. The modulator is expected to generate $2^M$ signals:

$$s_i = r_i e^{j\theta_i}, r_i > 0, 0 \le \theta_i \le 2\pi, i = 1, \ldots, 2^M, \quad (10)$$

In our example of a 16-QAM with two sets of 5 electrodes, as an input, the QAM transmitter accepts an electrical 4-bit digital input word, denoted $D_i$. The input word is mapped by two Digital-to-Digital Converters (DDC) onto each of the 10 (electrode) segments, whose lengths are the vectors $L^{1,2}$. Each DDC outputs a 5-bit word, denoted as $B_i^1$ and $B_i^2$. The output of transmitter can be written as:

$$E_{out,i} = \frac{1}{\sqrt{2}} E_{in} \exp\left\{j2\pi \sum_j^{N_1} B_{ij}^1 L_{ij}^1\right\} + \frac{1}{\sqrt{2}} E_{in} \exp\left\{-j2\pi \sum_j^{N_2} B_{ij}^2 L_j^2\right\} \quad (11)$$

where $E_{in}$ the optical field amplitude entering the modulator and $N_1, N_2$ are the number of segments on each arm. The elements $L_j^{1,2} \varepsilon L^{1,2}$ represent normalized electrode lengths on each arm. The two-level $B_{ij}^{1,2}$ coefficients are elements of the matrices $B_i^{1,2}$ and represent whether voltage v was applied to the j-th segment, on the respective arm. The index j enumerates the electrodes, j={1 ... $N_{1,2}$} on each arm. The summation is normalized to span $0 \le \Sigma_j^N B_{ij}^{1,2} L_j \le 1$, such that each arm induces a phaseshift of $0 \le \Delta\varphi \le 2\pi$.

The application of the electrical signals is preferably directly upon the modulator without any mediating circuits, referred to herein as "Direct Digital Driving". The modulator can be regarded as a 2D Digital-to-Analog (D/A) converter, that converts a digital word into an optical vector signal.

The design of the transmitter involves the setting of electrode lengths, $L^{1,2}$ and DDC mappings, $B_i^{1,2}$, that will generate all the required signals given in Eq. (10). An effective combination of the electrode lengths and digital mappings may be derived either by analytical methods or numerically. A simple numerical derivation will now be presented.

A ME-MZM with $N_{1,2}$ electrode segments on each arm is capable of generating $2^{(N_1+N_2)}$ signals. Thus, by choosing carefully the electrode lengths, and assuming the number of segments sufficient to generate at least $2^{(N_1+N_2)} > M$ different signals, all the required signals described by Eq. (10) can be picked out of the generated signals pool.

Figure 11A:
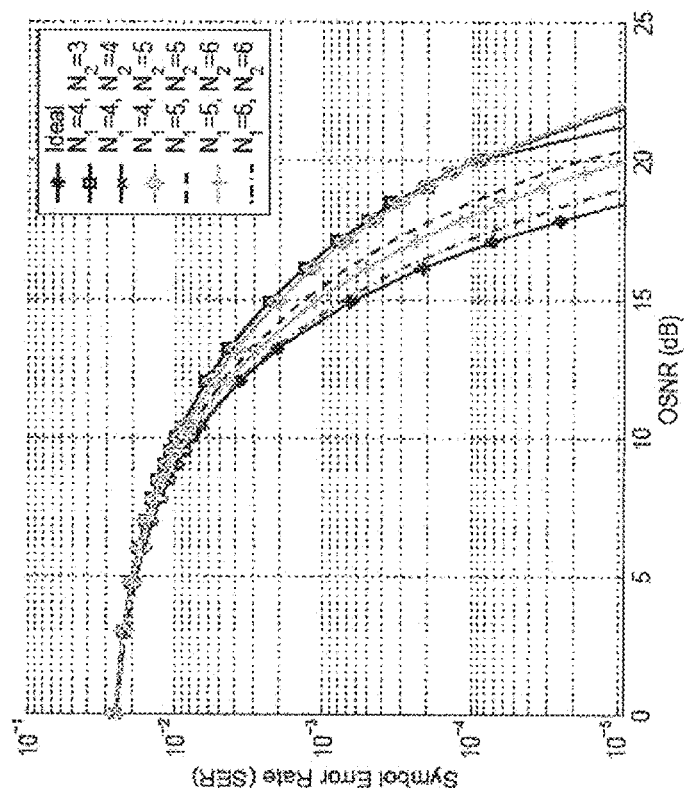
FIG. 11A is a constellation diagram for the device of FIG. 10 illustrating a choice of constellation points, and corresponding electrode actuation patterns, for implementing a 16-QAM modulator.

As an example, FIG. 11A shows the an ideal Square-16-QAM constellation, which is the required signal constellation, and a signal pool As an example, FIG. 11A shows the an ideal Square-16-QAM constellation, which is the required signal constellation, and a signal pool which was generated with {5,5} electrodes. The best matched signals at the pool are marked in figure. It can be seen that there is a good match between the ideal and the best matched generated constellations.

Table 1 compares between an ideal 16-QAM constellation and a generated constellation with different combinations of number of electrodes each arm. It presents the symbol minimum distance and the root mean square error. The latter provides a measure of agreement between the ideal and the generated constellations. Configurations with {2,2}, {2,3} and {3,3} electrodes provide less than 16 different signals (minimum distance of 0) and therefore cannot be used for generation of 16-QAM.

TABLE 1

| $N_1, N_2$ | Ideal | 4, 2 | 4, 3 | 4, 4 | 4, 5 | 5, 5 | 5, 6 | 6, 6 |
|---|---|---|---|---|---|---|---|---|
| Minimum Distance | 2 | 1.66 | 1.66 | 1.66 | 1.30 | 1.83 | 1.67 | 1.67 |
| RMSE | 0 | 4.64 | 4.64 | 4.53 | 4.42 | 4.64 | 4.52 | 4.57 |

Figure 11B:
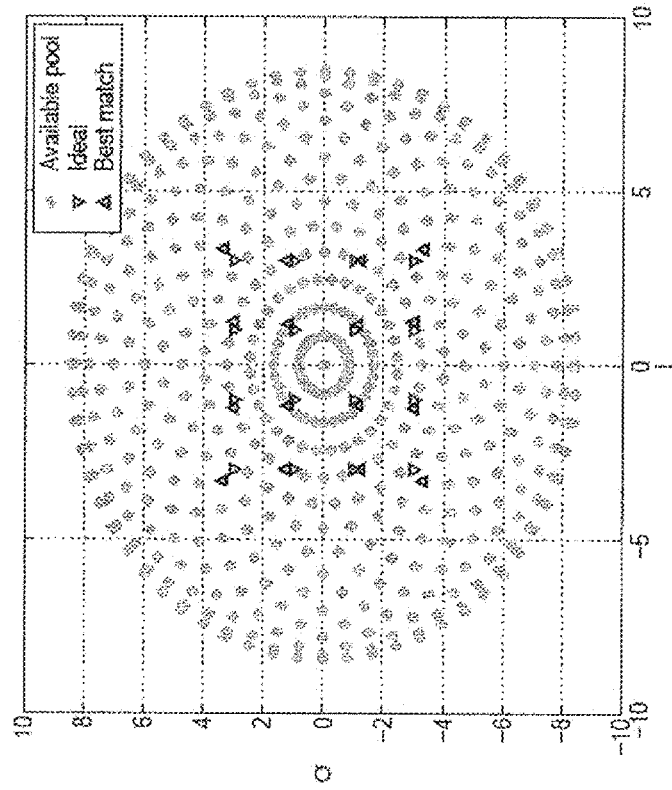
FIG. 11B is a graph showing the symbol error rate performance for the devices of FIG. 12A implemented with different numbers of electrodes.

FIG. 11B presents the Symbol Error Rate (SER) performance for a range of Signal to Noise Ratios (SNR) for an Additive White Gaussian Noise (AWGN) channel. It can be seen that when using {6,6} electrodes, the performance graph closely matches that of ideal 16-QAM constellation. Using a higher number of electrodes can lower the SER ever further toward the ideal curve. SER performance can be slightly improved by further tuning the decoding hypothesis testing at the receiver side to the generated constellation.

The electrode lengths used for the generation of FIG. 11B follow a binary sequences, $L^{1,2}=2^{-j}$. Tweaking the electrode lengths has small impact on the modulator performance. In Eq. (11), we assumed driving signals of 0 and $2V_\pi$. The high driving signal can be lowered by extending the total electrode length twice its size. The opposite signs in the exponents in the two terms of Eq. (11) are already implemented by the geometry of the electrode disposition of FIG. 10, when the signs of the voltages applied are the same, since then the electric fields have opposite directions. Other electrode dispositions exist for different cuts of the electro-optic crystals, and the appropriate way of applying the voltage with the right signs should be clear to a person skilled in the art.

Figure 12B:
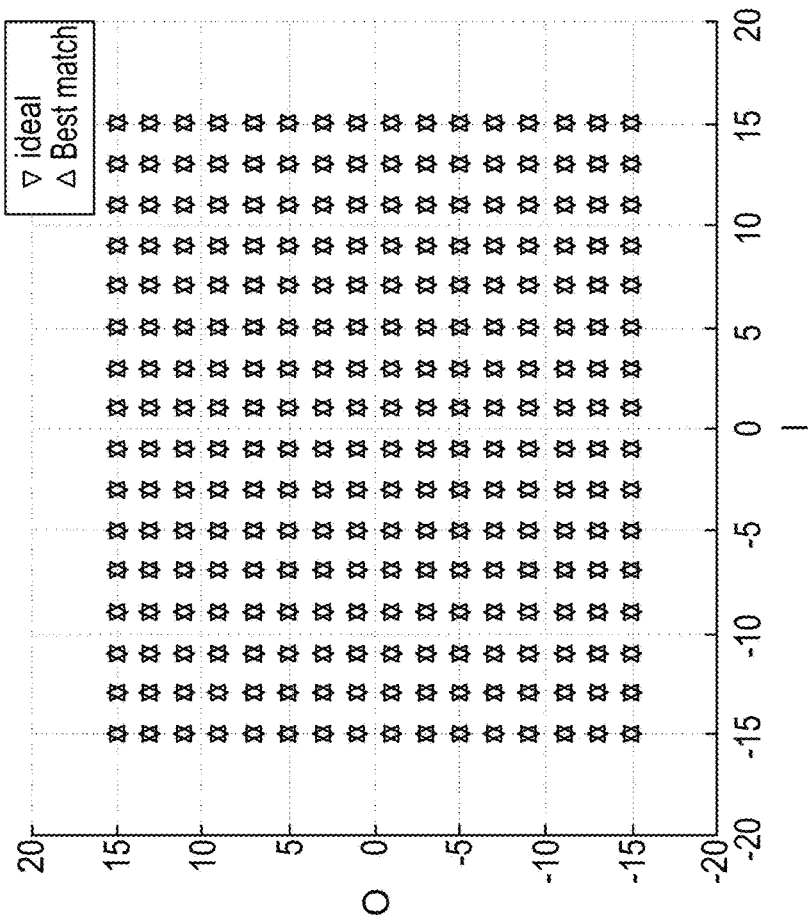
FIGS. 12A and 12B are simplified constellation diagrams showing only closest matching points for implementation of a 64-QAM using two sets of 7 electrodes and a 256-QAM using two sets of 10 electrodes, respectively.
Figure 12A:
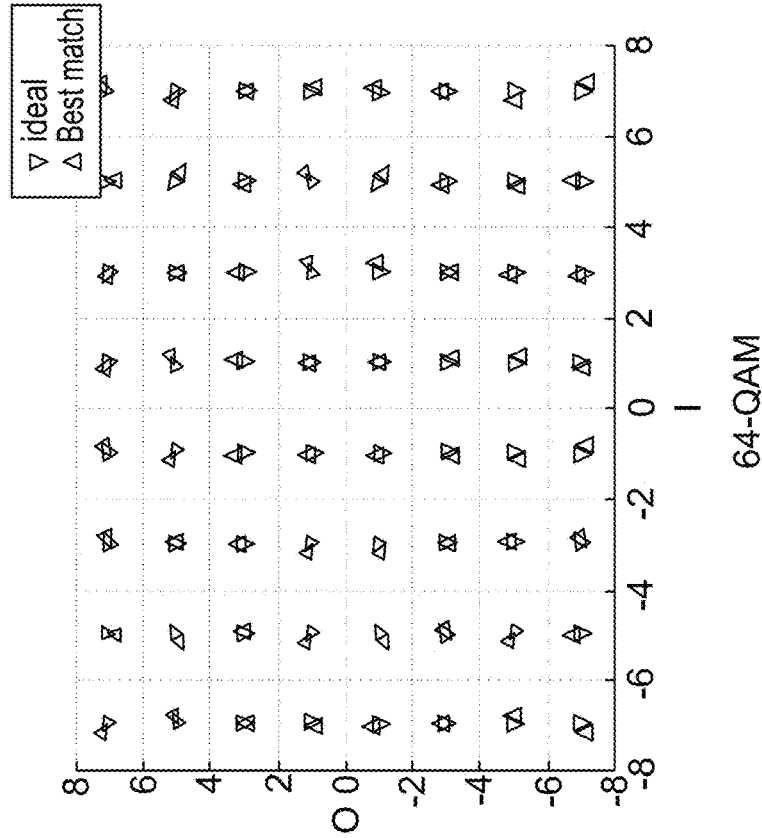
Figure 13A:
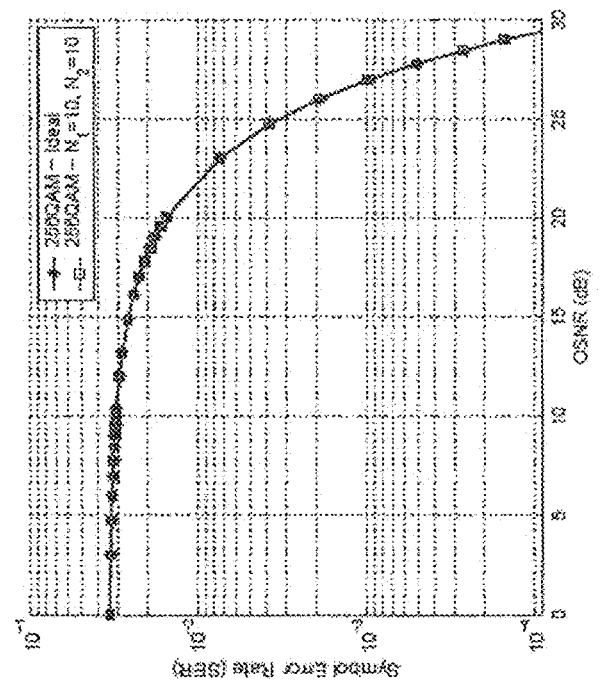
FIGS. 13A and 13B are graphs showing the symbol error rate performance for the devices of FIGS. 12A and 12B, respectively.
Figure 13B:
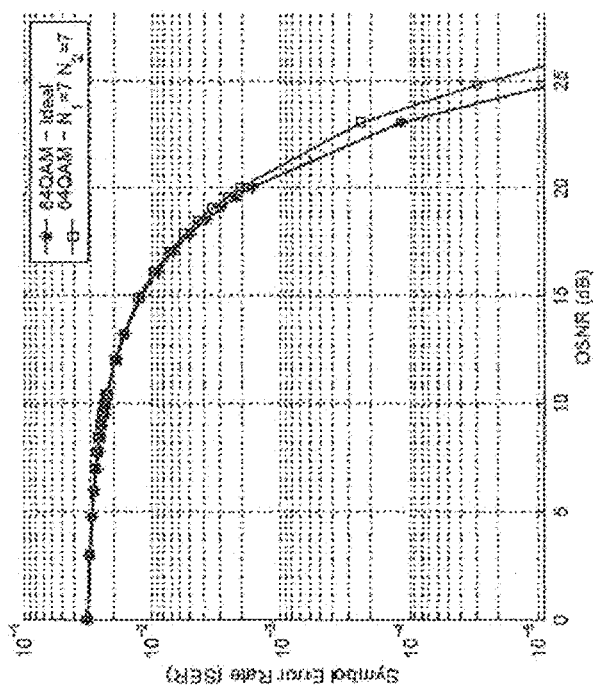
Figure 14:
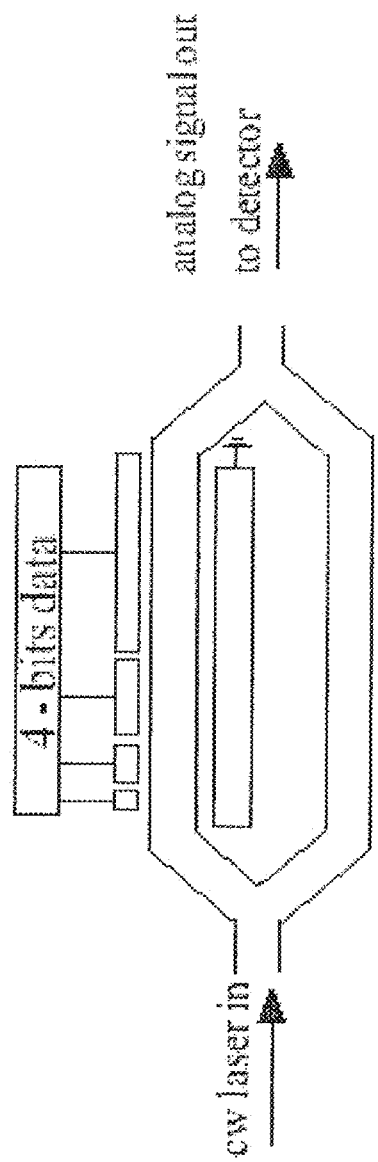
FIG. 14 is a schematic representation of a prior art Mach-Zehnder modulator configured as a DAC.

Referring now to FIGS. 12A-13B, it will be appreciated that the proposed modulator is capable of generating high order QAM constellations. FIG. 12A depicts the ideal 64-QAM constellation together with one generated using a {7,7} electrodes modulator, while FIG. 12B shows an ideal 256-QAM constellation together with the one generated using a {10,10} electrodes modulator. It can be seen that there is a good match between the ideal and the generated constellations. FIGS. 13A and 13B show the Symbol Error Rate performance for the generated constellations of FIGS. 12A and 12B, respectively.

A simple implementation of this embodiment described thus far generates Non-Return-to-Zero (NRZ) signals. NRZ permits constant intensity for similar consecutive bits, and is thus more susceptible to Inter-Symbol-Interference and other nonlinear propagation distortions. Return-to-Zero (RZ) format is a pulsed modulation where the signal "returns to zero" after every bit. This format provides better performance than NRZ, but usually requires additional hardware, such as a pulse carver. A transmitter based on the modulator of an embodiment of the invention can readily be extended to produce RZ pulses with minimal if any additional hardware. By adding an RZ control line to the DDC, as shown in FIG. 10, which serves as a trigger determining whether the output optical amplitude should be zero or other, the whole modulator will be capable of generating RZ signals. When the added control line is high, the DDC will map the electrode actuation pattern to the pattern corresponding to the middle point of the constellation, which is zero.

For the constellation presented in FIG. 10, $B_1=\{00010\}$ and $B_2=\{01110\}$ will output zero (or minimum) power because it will generate a phase difference of $\pi$ between the two arms of the MZM.

While the present invention has been presented as a digital-to-analog optical modulator, it should be noted that each embodiment of the invention may be modified to provide analog electrical output by use of an optical-to-electrical (O/E) converter. This option is illustrated in FIG. 1 as optional O/E converter 30. If the O/E converter itself has a non-linear response function, the present invention may advantageously be used to optimize the system parameters to linearize the electrical output rather than the (intermediate) optical output. Analogously, any nonlinearity induced by the optical medium used for transmitting the signal (e.g. optical fiber) can be compensated for by using O/E converter 30 as a linearizing device.

The present invention is applicable to substantially all applications requiring a DAC with optical or electrical output. Examples of particular interest include, but are not limited to, wireless communications systems, fiber-optic communication systems, cellular telephone networks, cable television, military applications, medical applications and hyper/super computer communications.

It will be appreciated that the above descriptions are intended only to serve as examples, and that many other embodiments are possible within the scope of the present invention as defined in the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

What is claimed is:

1. An optical modulation system, the system comprising:
    an input for receiving digital input words, each digital input word comprising a plurality of input data bits;
    a laser for generating a continuous wave optical signal;
    a modulator receiving the continuous wave optical signal; and
    a mapper, wherein based on a mapping, the mapper maps a digital input word received at the input to a corresponding digital output word comprising a plurality of digital output data bits,
    wherein the mapping specifies, for each digital word included in a set of possible digital input words for the plurality of input data bits, a corresponding digital output word from a set of possible digital output words for the plurality of output data bits;
    wherein, for a first subset of increasing successive digital input word values specified in the mapping, values of digital output words in the set of possible digital output words, corresponding respectively to digital input words in the first subset, decrease;
    wherein, for a second subset of increasing successive digital input word values specified in the mapping, values of digital output words in the set of possible digital output words, corresponding respectively to digital input words in the second subset, increase;
    wherein the optical modulation system is enabled to generate one or more analog signals based on the mapped digital output word comprising the plurality of digital output data bits; and
    wherein the modulator modulates the continuous wave optical signal based on the one or more analog signals; thereby generating one or more analog modulated optical signal outputs for transmission over one or more optical fibers.

2. The optical modulation system of claim 1, wherein, for a third subset of increasing successive digital input word values specified in the mapping, values of digital output words in the set of possible digital output words, corresponding respectively to digital input words in the third subset, remain the same.

3. The optical modulation system of claim 2, wherein for at least one of the first, the second, and the third subsets specified in the mapping, at least some of the digital input words in a respective subset are non-contiguous.

4. The optical modulation system of claim 1,
    wherein, for a fourth subset of decreasing successive digital input word values specified in the mapping, values of digital output words in the set of possible digital output words, corresponding respectively to digital input words in the fourth subset, decrease; and
    wherein, for a fifth subset of decreasing successive digital input word values specified in the mapping, values of digital output words in the set of possible digital output words, corresponding respectively to digital input words in the fifth subset, increase.

5. The optical modulation system of claim 4, wherein, for a sixth subset of decreasing successive digital input word values specified in the mapping, values of digital output words in the set of possible digital output words, corresponding respectively to digital input words in the sixth subset, remain the same.

6. The optical modulation system of claim 5, wherein for at least one of the fourth, the fifth, and the sixth subsets specified in the mapping, at least some of the digital input words in a respective subset are non-contiguous.

7. The optical modulation system of claim 1, wherein, for at least two different digital words included in the set of possible digital input words, the corresponding digital output words are the same.

8. The optical modulation system of claim 1, comprising one or more actuating electrodes, wherein the modulator actuates at least one actuating electrode based on the one or more analog signals.

9. An optical modulation system, the system comprising:
    an input for receiving digital input words, each digital input word comprising a plurality of input data bits;
    a laser for generating a continuous wave optical signal;
    a modulator receiving the continuous wave optical signal; and
    a mapper, wherein based on a mapping, the mapper maps each digital input word included in a set of digital input words received at the input to a corresponding digital output word comprising a plurality of digital output data bits;
    wherein, for a first plurality of digital input words having increasing values and to which the mapping is applied, values of digital output words, corresponding respectively to the first plurality of digital input words, decrease;
    wherein, for a second plurality of digital input words having increasing values and to which the mapping is applied, values of digital output words, corresponding respectively to the second plurality of digital input words, increase;
    wherein the optical modulation system is enabled to generate one or more analog signals based on the mapped digital output words; and wherein the modulator modulates the continuous wave optical signal based on the one or more analog signals;

thereby generating one or more analog modulated optical signal outputs for transmission over one or more optical fibers.

10. The optical modulation system of claim 9, wherein, for a third plurality of digital input words having increasing values and to which the mapping is applied, values of digital output words, corresponding respectively to the third plurality of digital input words, remain the same.

11. The optical modulation system of claim 10, wherein for at least one of the first, the second, and the third pluralities of digital input words, at least some of the digital input words in a respective plurality of digital input words are non-contiguous.

12. The optical modulation system of claim 9,
wherein, for a fourth plurality of digital input words having decreasing values and to which the mapping is applied, values of digital output words, corresponding respectively to the first plurality of digital input words, decrease; and
wherein, for a fifth plurality of digital input words having decreasing values and to which the mapping is applied, values of digital output words, corresponding respectively to the first plurality of digital input words, increase.

13. The optical modulation system of claim 12, wherein, for a sixth plurality of digital input words having decreasing values and to which the mapping is applied, values of digital output words, corresponding respectively to the first plurality of digital input words, remain the same.

14. The optical modulation system of claim 13, wherein for at least one of the fourth, the fifth, and the sixth pluralities of digital input words, at least some of the digital input words in a respective plurality of digital input words are non-contiguous.

15. The optical modulation system of claim 9, wherein, for at least two different digital input words to which the mapping is applied the corresponding digital output words are the same.

16. The optical modulation system of claim 9, comprising one or more actuating electrodes, wherein the modulator actuates at least one actuating electrode based on the one or more analog signals.

17. An optical modulation system, the system comprising:
an input for receiving digital input words, each digital input word comprising a plurality of input data bits;
a laser for generating a continuous wave optical signal;
a modulator receiving the continuous wave optical signal, wherein the modulator comprises at least one electrode; and
a mapper, and wherein based on a mapping, the mapper maps a digital input word received at the input to a corresponding digital output word comprising a plurality of digital output data bits;
wherein the mapping specifies, for each digital word included in a set of possible digital input words for the plurality of input data bits, a corresponding digital output word from a set of possible digital output words for the plurality of output data bits;
wherein for two successive input words received by the mapper, an analog voltage level based on the corresponding output words is either increased, decreased, or maintained the same to approximate to a desired modulation of an optical signal output as a function of the digital input words; and
wherein the analog voltage level based on the corresponding output words is applied to at least one electrode of the modulator, thereby modulating the continuous wave optical signal and generating one or more analog modulated optical signal outputs for transmission over one or more optical fibers.

18. The optical modulation system of claim 17, wherein the desired modulation of the continuous wave optical signal is a linear modulation.

19. The optical modulation system of claim 17, wherein a natural response of the modulator is associated with a first function and the desired modulation is associated with a second function;
and wherein the second function is different from the first function.

* * * * *